United States Patent
Ando et al.

(10) Patent No.: US 7,226,505 B2
(45) Date of Patent: Jun. 5, 2007

(54) METHOD FOR VANISHING DEFECTS IN SINGLE CRYSTAL SILICON AND SINGLE CRYSTAL SILICON

(75) Inventors: Masahiko Ando, Hiratsuka (JP); Masaru Yuyama, Hiratsuka (JP); Shiro Yoshino, Hiratsuka (JP)

(73) Assignee: Sumco Techxiv Corporation, Hiratsuka-shi, Kanagawa (JP)

( * ) Notice: Subject to any disclaimer, the term of this patent is extended or adjusted under 35 U.S.C. 154(b) by 345 days.

(21) Appl. No.: 10/500,268

(22) PCT Filed: Dec. 25, 2002

(86) PCT No.: PCT/JP02/13477

§ 371 (c)(1),
(2), (4) Date: Jun. 23, 2004

(87) PCT Pub. No.: WO03/056621

PCT Pub. Date: Jul. 10, 2003

(65) Prior Publication Data

US 2005/0081778 A1    Apr. 21, 2005

(30) Foreign Application Priority Data

Dec. 26, 2001 (JP) ............................. 2001-394791

(51) Int. Cl.
    *C30B 15/20* (2006.01)
(52) U.S. Cl. .............................. 117/13; 117/19; 117/20
(58) Field of Classification Search .................. 117/13, 117/19, 20
    See application file for complete search history.

(56) References Cited

FOREIGN PATENT DOCUMENTS

| EP | 0 889 510 | 1/1999 |
|----|-----------|--------|
| EP | 1 035 235 | 9/2000 |
| JP | 07201874  | 8/1995 |
| JP | 09194294  | 7/1997 |

OTHER PUBLICATIONS

Adachi, et al.; "Reduction of Grown-In Defects by High Temperature Annealing," *Journal of The Electrochemical Society*, vol. 147 (1), pp. 350-353, 2000.

Umeno et al.; "Dependence of Grown-In Defect Behavior on Oxygen Concentration in Czochralski Silicon Crystals," *Jpn. J. Appl. Phys.*, vol. 38, Pt. 1, No. 10, pp. 5725-5730, 1999.

Wijaranakula et al.; "Effect of high-temperature annealing on the dissolution of the D-defects in n-type Czochralski silicon," *Appl. Phys. Lett.*, vol. 64 (8), pp. 1030-1032, Feb. 21, 1994.

*Primary Examiner*—Felisa Hiteshew
(74) *Attorney, Agent, or Firm*—Welsh & Katz, Ltd.

(57) ABSTRACT

A method for eliminating defects in single crystal silicon, which comprises subjecting single crystal silicon prepared by the CZ method to an oxidation treatment and then to an ultra high temperature heat treatment at a temperature of at least 1300° C., or comprises subjecting single crystal silicon which is prepared by the CZ method and is not subjected to an oxidation treatment (a bare wafer) to an ultra high temperature heat treatment in an oxygen atmosphere and at a temperature of higher than 1200° C. and lower than 1310° C. The method allows the elimination of void defects present in single crystal silicon with reliability.

11 Claims, 20 Drawing Sheets

FIG.2

| TREATMENT TEMPERATURE /TIME | OXYGEN PARTIAL PRESSURE IN ARGON GAS | | |
|---|---|---|---|
| | 0.5% | 30% | 100% |
| 1300°C, 2 HOURS | × | × | |
| 1350°C, 2 HOURS | × | × | × |
| 1390°C, 2 HOURS | × | × | × |

×: ENLARGEMENT
△: SHRINKAGE
○: DISAPPEARANCE

FIG.3

| TREATMENT TEMPERATURE /TIME | OXYGEN PARTIAL PRESSURE IN ARGON GAS | | |
|---|---|---|---|
| | 0.5% | 30% | 100% |
| 1300°C, 2 HOURS | ○ | △ | △ |
| 1350°C, 2 HOURS | ○ | ○ | ○ |
| 1390°C, 2 HOURS | ○ | ○ | ○ |

×: ENLARGEMENT
△: SHRINKAGE
○: DISAPPEARANCE

FIG.4

| TREATMENT TEMPERATURE /TIME | ATMOSPHERE | INITIAL OXIDE FILM THICKNESS (nm) | | | | | |
|---|---|---|---|---|---|---|---|
| | | 0* | 45 nm | 175 nm | 396 nm | 500 nm | 700 nm |
| 1350°C, 2 HOURS | 0.5% $O_2$/Ar | × | × | × | △ | ○ | ○ |
| 1350°C, 2 HOURS | 30% $O_2$/Ar | × | × | × | × | ○ | ○ |
| 1350°C, 2 HOURS | 100% $O_2$ | × | × | × | × | ○ | ○ |

\*: NATURAL OXIDE FILM
×: ENLARGEMENT
△: SHRINKAGE
○: DISAPPEARANCE

FIG.5

| OXIDE FILM THICKNESS | OXIDE FILM FORMATION METHOD | VOID DEFECTS |
|---|---|---|
| 440 | CVD | △ |
| 720 | CVD | △ |
| 55 | DRY OXIDATION | × |
| 164 | DRY OXIDATION | × |
| 274 | DRY OXIDATION | × |
| 400 | DRY OXIDATION | ○ |
| 840 | DRY OXIDATION | ○ |
| 75 | WET OXIDATION | × |
| 159 | WET OXIDATION | × |
| 377 | WET OXIDATION | × |
| 720 | WET OXIDATION | ○ |

×: ENLARGEMENT
△: SHRINKAGE
○: DISAPPEARANCE

FIG.6

| TREATMENT TEMPERATURE /TIME | OXYGEN PARTIAL PRESSURE | | |
|---|---|---|---|
| | VOID DEFECTS | | |
| 1200°C, 2 HOURS | NO CHANGE | | |
| 1240°C, 2 HOURS | ○ | | |
| 1260°C, 2 HOURS | ○ | | |
| 1280°C, 2 HOURS | ○ | | |
| 1300°C, 2 HOURS | ○ | | |
| 1310°C, 2 HOURS | × | | |
| 1320°C, 2 HOURS | × | | |
| 1350°C, 2 HOURS | × | | |
| 1390°C, 2 HOURS | × | | |

×: ENLARGEMENT
△: SHRINKAGE
○: DISAPPEARANCE

FIG.18

| TEMPERATURE | INITIAL OXYGEN CONCENTRATION | | | |
|---|---|---|---|---|
| | 10e17 (atoms/cc) | | 15e17 (atoms/cc) | |
| | ATMOSPHERE DURING HEATING | | ATMOSPHERE DURING HEATING | |
| | 0.5% | 100% | 0.5% | 100% |
| 1200°C | NO CHANGE | NO CHANGE | NO CHANGE | NO CHANGE |
| 1210°C | △ | △ | NO CHANGE | NO CHANGE |
| 1220°C | △ | △ | NO CHANGE | NO CHANGE |
| 1230°C | △ | ○ | NO CHANGE | NO CHANGE |
| 1240°C | ○ | ○ | NO CHANGE | NO CHANGE |
| 1260°C | ○ | ○ | NO CHANGE | NO CHANGE |
| 1280°C | ○ | ○ | NO CHANGE | NO CHANGE |
| 1300°C | ○ | ○ | × | △ |
| 1310°C | × | ○ | × | ○ |
| 1320°C | × | ○ | × | ○ |
| 1330°C | × | ○ | × | ○ |
| 1340°C | × | ○ | × | ○ |
| 1350°C | × | ○ | × | ○ |

×: ENLARGEMENT
△: SHRINKAGE
○: DISAPPEARANCE

FIG.19

| TEMPERATURE | OXYGEN ATMOSPHERE DURING HEAT TREATMENT (INCLUDING HEATING) | | | | | | | |
|---|---|---|---|---|---|---|---|---|
| | INITIAL OXYGEN CONCENTRATION: 10e17 atoms/cc | | | | INITIAL OXYGEN CONCENTRATION: 15e17 atoms/cc | | | |
| | 25% | 50% | 75% | 100% | 25% | 50% | 75% | 100% |
| 1260°C | ○ | ○ | ○ | ○ | NO CHANGE | NO CHANGE | NO CHANGE | NO CHANGE |
| 1280°C | ○ | ○ | ○ | ○ | NO CHANGE | NO CHANGE | NO CHANGE | NO CHANGE |
| 1300°C | ○ | ○ | ○ | ○ | NO CHANGE | △ | △ | △ |
| 1320°C | ○ | ○ | ○ | ○ | × | △ | △ | △ |
| 1340°C | ○ | ○ | ○ | ○ | × | △ | △ | ○ |
| 1350°C | ○ | ○ | ○ | ○ | × | △ | △ | ○ |

METHOD FOR VANISHING DEFECTS IN SINGLE CRYSTAL SILICON AND SINGLE CRYSTAL SILICON

TECHNICAL FIELD

This invention relates to single crystal silicon manufactured by the CZ method, and more particularly relates to a method for eliminating void defects present in as-grown single crystal silicon produced by the CZ method, and to single crystal silicon that has undergone this elimination treatment.

BACKGROUND ART

Silicon wafers are manufactured by growing ingots by the CZ (Czochralski) method. Specifically, a quartz crucible is provided inside a CZ furnace, and polycrystalline silicon (Si) is heated and melted inside this quartz crucible. Once the melting stabilizes, an ingot of single crystal silicon is pulled out of the silicon melt inside the quartz crucible by a pulling mechanism.

Oxygen is eluted from the quartz crucible in the course of the melting, and this oxygen melts inside the ingot of single crystal silicon. Consequently, an ingot of single crystal silicon usually contains about $5\times10^{17}$ to $2\times10^{18}$ (atoms/cm$^3$) (ASTM F121-79) of oxygen. In this Specification, numerical values for oxygen concentration will be as set forth in ASTM F121-79.

The molten portion consisting of the boundary between the melt and the single crystal ingot does not cool down as soon as it is pulled out, and instead is cooled through hysteresis. In the course of this hysteresis, holes become supersaturated under ordinary pulling conditions. These holes group together to form polyhedral cavity defects, called void defects, in an as-grown single crystal silicon ingot. Since the silicon ingot is in a state in which oxygen has been dissolved to the point of supersaturation, oxide films are formed during cooling on the inside of the cavities. Void defects are called grown-in defects because they are formed during single crystal growth by the CZ method. Defect pits produced by the appearance of void defects on the surface of a silicon wafer are called COPs.

Void defects adversely affect yield and the reliability of manufactured semiconductor devices when such devices are manufactured by adding device layers to a silicon wafer.

It is therefore necessary to eliminate void defects, and annealing a silicon wafer at a high temperature used to be considered the best approach to eliminating void defects. However, if silicon wafers are annealed one by one, there is the danger that thermal strain will be produced and the support members supporting the silicon wafers will be subjected to stress and lose some of their durability, or that crystal defects called slips will be produced.

The above problems have been solved by performing stack annealing rather than heat treating silicon wafers one at a time at high temperature, as disclosed in Japanese Patent Application Laid-Open No. 10-74771. Specifically, the above-mentioned application states the following.

(a) The disclosed invention discusses an attempt to eliminate void defects by laminating a plurality of silicon wafers into a group, vertically stacking one or more groups of silicon wafers, orienting the silicon wafers in each group, and performing a high-temperature heat treatment (stack annealing).

(b) It is stated that void defects are eliminated when silicon wafers are heat treated at a high temperature of between 1100 and 1380° C. In this case, it is stated that void defects are eliminated in any conceivable atmosphere for the heat treatment, such as an oxygen gas atmosphere, oxygen gas-containing atmosphere, inert gas atmosphere, or reductive gas atmosphere.

(c) Because stacked silicon wafers are difficult to separate after heat treatment, it is stated that separation after heat treatment can be facilitated by forming an oxide film on the silicon wafers ahead of time, and stack-annealing in an atmosphere of hydrogen or argon gas.

Thus, it used to be thought that void defects disappeared when silicon wafers were subjected to high-temperature heat treatment.

In view of this, the inventors of the present invention conducted follow-up tests under the temperature and atmosphere conditions given in the above-mentioned publication.

As a result, it was found that not only do void defects in silicon wafer not disappear, they actually become larger.

FIGS. 1b and 1c schematically illustrate the follow-up testing that was conducted.

As shown in FIG. 1b, the inventors first readied a silicon wafer (silicon substrate) 1 with a low oxygen concentration (an initial oxygen concentration of about $9\times10^{-17}$ (atoms/cc)). As-grown void defects 3 with a diameter of about 100 nm were present in this silicon wafer 1.

This silicon wafer 1 was then subjected to ultra high temperature heat treatment at 1300° C. or higher in an oxygen gas atmosphere (in which the oxygen gas had a 100% oxygen partial pressure) or an oxygen gas-containing atmosphere (in which the oxygen gas had an oxygen partial pressure of at least 0.5%). As a result, it was confirmed that the void defects 3 in the as-grown silicon wafer 1 grew from a size of about 100 nm to about 500 nm. Also, as shown in FIG. 1c, silicon wafers 1 were stacked, and these stacked silicon wafers 1 were subjected to an ultra high temperature heat treatment at 1300° C. or higher and in the same oxygen gas atmosphere or oxygen gas-containing atmosphere, whereupon it was confirmed that once again the void defects 3 became larger around the outer periphery of the middle silicon wafers 1 and on the oxide film 2 side of the uppermost and lowermost silicon wafers 1.

When an ultra high temperature heat treatment is performed at 1300° C. or higher and in an atmosphere of argon gas or another such inert gas, or in an atmosphere of hydrogen gas or another such reductive gas, silicon oxides (SiOx) that sublimate and separate from the silicon wafer 1 foul the reaction tube or boat, and lead to the deterioration of the SiC boat itself. To prevent this furnace fouling and decrease in furnace durability, it is essential that when the high-temperature heat treatment at 1300° C. or higher be performed substantially in an oxygen gas-containing atmosphere or an oxygen gas atmosphere.

DISCLOSURE OF THE INVENTION

The present invention was conceived in light of this situation, and it is an object thereof to be able to effectively eliminate void defects present in single crystal silicon.

The method of the first invention of the present invention comprises the steps of:

performing an oxidation treatment on single crystal silicon manufactured by the CZ method; and performing an ultra high temperature heat treatment at a temperature of at least about 1300° C., and thereby eliminating any void defects present in the single crystal silicon.

With the first invention, as shown in FIG. 1a, single crystal silicon 1 manufactured by the CZ method is subjected to an oxidation treatment, and subjected to an ultra high temperature heat treatment at a temperature of at least about 1300° C. (see FIG. 16), which allows any void defects 3 present in the single crystal silicon 1 to be eliminated.

The second invention comprises the steps of:

performing an oxidation treatment on single crystal silicon manufactured by the CZ method, and forming an initial oxide film with a minimum thickness of between 396 and 400 nm; and performing an ultra high temperature heat treatment at a temperature of at least about 1300° C., and thereby eliminating any void defects present in the single crystal silicon.

With the second invention, as shown in FIG. 1a, single crystal silicon 1 manufactured by the CZ method is subjected to an oxidation treatment, an initial oxide film 2 with a minimum thickness of between 396 and 400 nm is formed (see FIGS. 11 and 14), and an ultra high temperature heat treatment is performed at a temperature of at least about 1300° C. (see FIG. 16), which allows any void defects 3 present in the single crystal silicon 1 to be eliminated.

The third invention comprises the steps of performing an oxidation treatment on a block of single crystal silicon manufactured by the CZ method; and performing an ultra high temperature heat treatment at a temperature of at least about 1300° C., and thereby eliminating any void defects present in the block of single crystal silicon.

With the third invention, the method of the first invention can be applied to a block of single crystal silicon.

The fourth invention comprises the steps of:

performing an oxidation treatment on a wafer of single crystal silicon manufactured by the CZ method;

laminating a plurality of the single crystal silicon wafers; and performing an ultra high temperature heat treatment at a temperature of at least about 1300° C. on the plurality of laminated single crystal silicon wafers, and thereby eliminating any void defects present in the single crystal silicon wafers.

With the fourth invention, the method of the first invention can be applied to plurality of laminated single crystal silicon.

The fifth invention is characterized in that, in the first to fourth inventions, the ultra high temperature heat treatment is performed in an atmosphere with an oxygen partial pressure of 0.5 to 100%.

The sixth invention is characterized in that, in the first to fourth inventions, the oxygen concentration in the single crystal silicon is no more than $14 \times 10^{17}$ (atoms/cc).

The seventh invention is characterized in that, in the first to fourth inventions, the oxidation treatment is performed in the course of raising the temperature to the level at which the ultra high temperature heat treatment is performed.

The eighth invention is characterized in that, in the first to fourth inventions, there is further provided a step of performing the oxidation treatment at a temperature of 1200° C. or lower in the course of raising the temperature to the level at which the ultra high temperature heat treatment is performed.

The ninth invention is characterized in that, in the first to fourth inventions, there is further provided a step of performing a heat treatment for forming oxygen precipitation nuclei in the single crystal silicon at a temperature of 400 to 1000° C. in the course of raising or lowering the temperature to or from the level at which the ultra high temperature heat treatment is performed.

The tenth invention is characterized in that, in the first to fourth inventions, one or more stages of heat treatment are further performed at a temperature of 400 to 1000° C. after the ultra high temperature heat treatment has been performed, and oxygen precipitation nuclei are formed in the single crystal silicon.

The method of the eleventh invention comprises performing an ultra high temperature heat treatment in an oxygen atmosphere and at a temperature over 1200° C. but lower than 1310° C. on single crystal silicon that has been manufactured by the CZ method and that has not undergone an oxidation treatment, thereby eliminating any void defects present in the single crystal silicon.

With the method of the eleventh invention, single crystal silicon that has been manufactured by the CZ method and that has not undergone an oxidation treatment (a bare wafer) is subjected to an ultra high temperature heat treatment in an oxygen atmosphere and at a temperature over 1200° C. but lower than 1310° C., thereby eliminating any void defects present in the single crystal silicon.

With the twelfth invention, single crystal silicon is manufactured by the CZ method, an initial oxide film is formed on the surface thereof and an ultra high temperature heat treatment is then performed at a temperature of at least about 1300° C.

The twelfth invention comprises limiting the method of the first invention as an invention of product.

With the thirteenth invention, an initial oxide film with a minimum thickness of between 396 and 400 nm is formed on the surface of single crystal silicon manufactured by the CZ method, after which an ultra high temperature heat treatment is performed at a temperature of at least about 1300° C.

The thirteenth invention comprises limiting the method of the second invention as an invention of product.

With the fourteenth invention, an initial oxide film is formed on the surface of a block of single crystal silicon manufactured by the CZ method, after which an ultra high temperature heat treatment is performed at a temperature of at least about 1300° C.

The thirteenth invention comprises limiting the method of the third invention as an invention of product.

With the fifteenth invention, single crystal silicon manufactured by the CZ method is subjected to an ultra high temperature heat treatment in an oxygen atmosphere and at a temperature over 1200° C. but lower than 1310° C. and without any initial oxide film being formed on the surface.

The fifteenth invention comprises limiting the method of the eleventh invention as an invention of product.

The sixteenth invention is a method for eliminating defects from single crystal silicon, in which single crystal silicon that has been manufactured by the CZ method and that has not undergone an oxidation treatment is subjected to an ultra high temperature heat treatment by being heated to an ultra high temperature in an oxygen gas atmosphere or an atmosphere containing oxygen gas, and then cooled, thereby eliminating any void defects present in the single crystal silicon, wherein void defects present in the single crystal silicon are eliminated by adjusting the parameters comprising the initial oxygen concentration in the single crystal silicon, the oxygen partial pressure of the atmosphere during heating up to the ultra high temperature, the oxygen partial pressure of the atmosphere during the ultra high temperature heat treatment, and the temperature at which the ultra high temperature heat treatment is performed.

The seventeenth invention is characterized in that, in the sixteenth invention, the oxygen partial pressure of the atmosphere during the ultra high temperature heat treatment is at least 50%, the oxygen partial pressure of the atmosphere during heating up to the ultra high temperature is less than 25%, and the temperature at which the ultra high temperature heat treatment is performed is over 1200° C. but lower than 1310° C.

The eighteenth invention is characterized in that, in the sixteenth invention, the oxygen partial pressure of the atmosphere during the ultra high temperature heat treatment is at least 25%, the oxygen partial pressure of the atmosphere during heating up to the ultra high temperature is at least 25%, and the temperature at which the ultra high temperature heat treatment is performed is at least 1200° C.

The nineteenth invention is characterized in that, in the sixteenth invention, the oxygen partial pressure of the atmosphere during the ultra high temperature heat treatment and the oxygen partial pressure of the atmosphere during heating up to the ultra high temperature are at least 25%, and the temperature at which the ultra high temperature heat treatment is performed is at least 1240° C.

The twentieth invention is characterized in that, in the sixteenth invention, as the initial oxygen concentration in the single crystal silicon rises above $10 \times 10^{17}$ (atoms/cc), the temperature at which the ultra high temperature heat treatment is performed is raised above 1260° C., and the oxygen partial pressure of the atmosphere during the ultra high temperature heat treatment and the oxygen partial pressure of the atmosphere during heating up to the ultra high temperature are raised above 25%.

Experiments conducted by the inventors have revealed that the conditions for eliminating the void defects 3 vary with the following parameters.

① The initial oxygen concentration in the single crystal silicon 1

② The oxygen partial pressure of the atmosphere in the course of raising the temperature to the level during high-temperature annealing ③ The oxygen partial pressure of the atmosphere while the high-temperature annealing is being performed ④ The temperature at which the high-temperature annealing is performed.

The ranges for the various parameters for eliminating the void defects 3 are specifically set forth below.

1) The void defects 3 can be eliminated within a temperature range of over 1200° C. and lower than 1310° C. if the oxygen partial pressure during high-temperature annealing is at least 50% and the oxygen partial pressure of the atmosphere during heating up to the temperature of the high-temperature annealing is less than 25%.

2) The void defects 3 can be eliminated when the temperature during the high-temperature annealing is 1200° C. or higher if the oxygen partial pressure during the high-temperature annealing is at least 25% and the oxygen partial pressure of the atmosphere during heating up to the temperature of the high-temperature annealing is at least 25%.

3) The void defects 3 can be eliminated if the oxygen partial pressure of the atmosphere (during high-temperature annealing and during heating) is at least 25% and the temperature during high-temperature annealing is at least 1240° C.

4) The void defects 3 can be eliminated if, as the initial oxygen concentration in the single crystal silicon 1 rises above $10 \times 10^{17}$ (atoms/cc), the temperature during high-temperature annealing is raised above 1260° C., and the oxygen partial pressure of the atmosphere (during high-temperature annealing and during heating) is raised above 25%.

BRIEF DESCRIPTION OF THE DRAWINGS

FIG. 2 is a table of the conditions and results in Comparative Example 1;

FIG. 3 is a table of the conditions and results in Example 1;

FIG. 4 is a table of the conditions and results in Example 2;

FIG. 5 is a table of the conditions and results in Example 3;

FIG. 6 is a table of the conditions and results in Example 6;

FIG. 18 is a table of the changes in the size of void defects after high-temperature annealing when the initial oxygen concentration, the oxygen partial pressure of the atmosphere during heating, and the temperature during high-temperature annealing were varied;

FIG. 19 is a table of experiment results when the oxygen partial pressure of the atmosphere during heating and during high-temperature annealing was the same, and illustrates the relationship of the oxygen partial pressure of the atmosphere, the initial oxygen concentration, and the temperature during high-temperature annealing to changes in the size of the void defects after high-temperature annealing;

BEST MODE FOR CARRYING OUT THE INVENTION

Embodiments of the method for eliminating defects from single crystal silicon and of the single crystal silicon pertaining to the present invention will now be described through reference to the drawings.

In this Specification, the term "single crystal silicon" is used in a sense that encompasses a block (ingot) of single crystal silicon, a silicon wafer (silicon substrate) sliced from a block, and a plurality of stacked silicon wafers.

Figure 1:
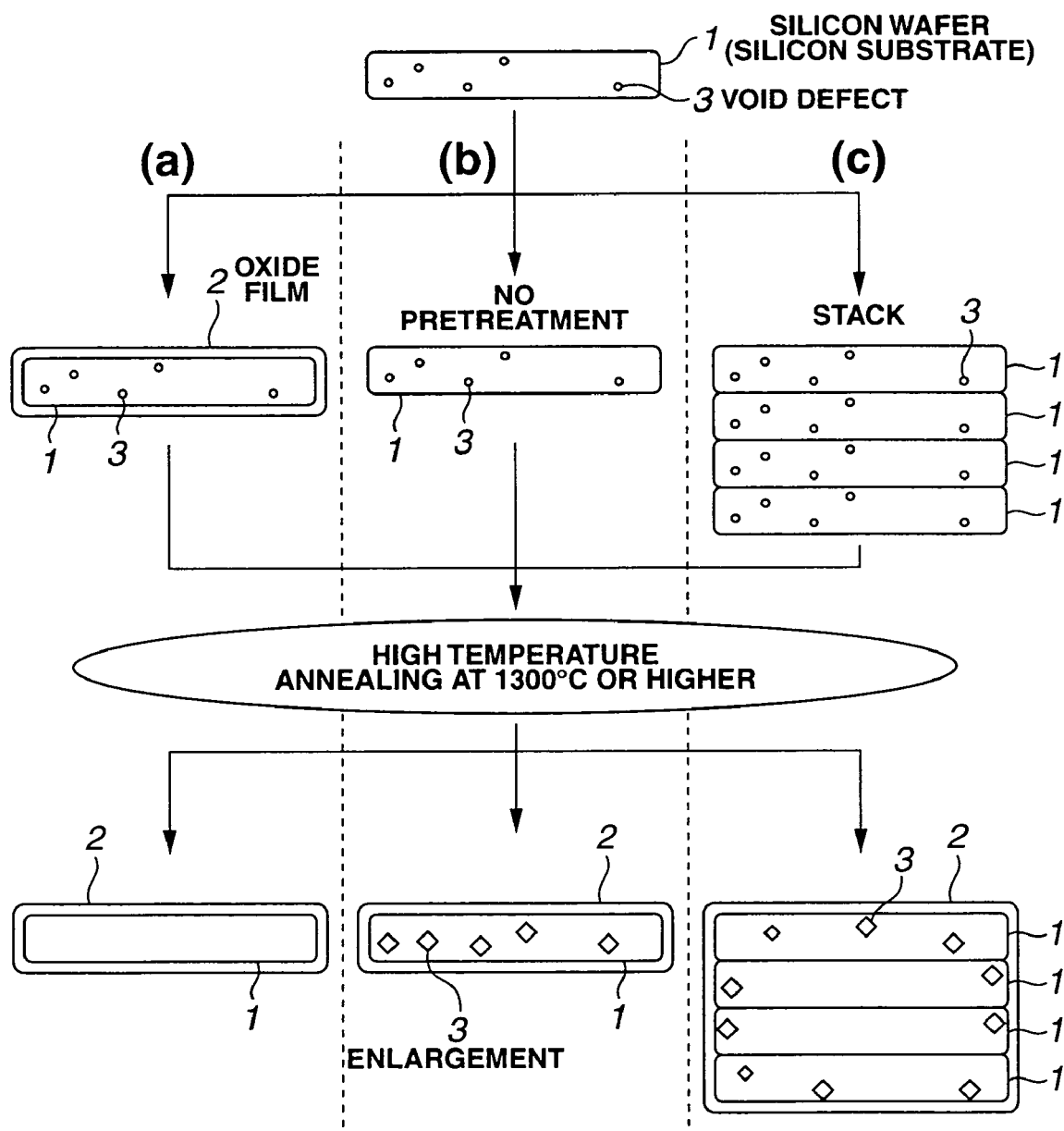
FIG. 1 is a diagram comparing embodiments with prior art.

FIG. 1a is a schematic depiction of a first embodiment of the method of the present invention.

First Embodiment

First, a silicon wafer 1 was acquired by slicing an ingot (block) of single crystal silicon grown by the CZ method. This silicon wafer 1 contained oxygen in a low concentration. Specifically, the silicon wafer 1 is assumed to contain oxygen in an initial oxygen concentration of about $9 \times 10^{17}$ (atoms/cc) (ASTM F121-79). Void defects 3 with a diameter of about 100 nm were present in the as-grown silicon wafer 1.

Next, the silicon wafer 1 was subjected to an oxidation treatment to form an oxide film 2 with a thickness of at least 400 nm on the silicon wafer 1.

Next, the silicon wafer 1 was subjected to an ultra high temperature heat treatment (annealing) in an oxygen atmosphere containing at least 0.5% oxygen and at a temperature of at least 1300° C.

As a result, the void defects 3 that had been present in the silicon wafer 1 disappeared.

As discussed above, with prior art, as described through reference to FIGS. 1b and 1c, the void defects 3 became larger because no oxidation treatment was performed prior to the ultra high temperature annealing in an oxygen gas-containing atmosphere and at 1300° C. or higher, but in this embodiment, the void defects 3 could be eliminated because an oxidation treatment was performed prior to the ultra high temperature annealing in an oxygen gas-containing atmosphere and at 1300° C. or higher.

As shown in FIG. 1c, when the silicon wafers 1 were stack-annealed, the void defects 3 were seen to shrink even though no oxidation treatment was performed prior to the ultra high temperature annealing. The part of the void defects 3 that shrank was the part other than around the outer periphery of the middle silicon wafers 1 and on the oxide film 2 side of the uppermost and lowermost silicon wafers 1, and in particular the void defects 3 disappeared at the boundaries between the laminated silicon wafers 1. The void defects 3 did not shrink, and in fact became larger, around the outer periphery of the middle silicon wafers 1 and on the oxide film 2 side of the uppermost and lowermost silicon wafers 1.

In FIG. 1a, a single silicon wafer 1 was subjected to oxidation treatment and high-temperature heat treatment, but it is also possible to subject a plurality of silicon wafers 1 to oxidation treatments, stack these silicon wafers 1, and subject the stacked silicon wafers 1 to high-temperature annealing in an oxygen gas-containing atmosphere and at 1300° C. or higher. In this case, unlike with prior art, the void defects 3 can be eliminated from around the outer periphery of the middle silicon wafers 1 and on the oxide film 2 side of the uppermost and lowermost silicon wafers 1.

Thus, with this embodiment, since an oxidation treatment is performed prior to a high-temperature heat treatment in an oxygen gas-containing atmosphere and at 1300° C. or higher, the void defects 3 in silicon wafer 1 or in the stacked silicon wafers 1 can be effectively eliminated. Also, with this embodiment, a case is assumed in which the oxidation treatment and high-temperature heat treatment are performed on a silicon wafer 1 sliced from a block (ingot) of single crystal silicon, but the oxidation treatment and high-temperature heat treatment may instead be performed directly on a block of single crystal silicon, in which case the void defects 3 present in the block of single crystal silicon can be effectively eliminated.

Let us now consider the mechanism by which the void defects 3 are eliminated.

In general, in the formation of the thermal oxide film 2 on the silicon wafer 1, it is known that volumetric expansion accompanying oxide film formation results in interstitial silicon being injected from the boundary between the silicon wafer 1 and the oxide film 2 toward the interior of the silicon wafer 1.

The oxide film growth rate during high-temperature treatment is affected by whether or not the high-temperature heat treatment is preceded by a pre-oxidation treatment. Specifically, if the silicon wafer 1 has not undergone initial oxide film formation, then oxidation will occur abruptly during the subsequent high-temperature heat treatment in an oxygen gas-containing atmosphere, whereas the oxide film growth rate will be slower with a silicon wafer on which an initial oxide film has been formed.

If we assume here that the void defects 3 will become larger inside a silicon wafer 1 with a high oxidation rate, then the void defects 3 are hole clusters, so the interstitial silicon injection cannot be explained, and a phenomenon such as hole injection should actually occur.

In view of this, the shrinkage of defects, or the decrease in the enlargement thereof, is described as follows for a case in which it is assumed that "holes are injected as a result of high-temperature heat treatment at 1300° C. or higher," even though the exact mechanism remains unclear.

Specifically, when the silicon wafer 1 is subjected to a high-temperature heat treatment at 1300° C. or higher, it is believed that if the oxygen concentration in the silicon wafer 1 is below the solid solution limit at that temperature, then the oxide film on the inner walls of the void defects 3 will dissolve, and the void defects 3 present as hole clusters will tend to become a solution and disappear. However, if we assume that there is injection of holes from the surface of the silicon wafer 1 into its interior under high-temperature treatment, then it seems that the holes cluster into the void defects 3 and the void defects 3 themselves become larger. To prevent the void defects 3 from becoming larger, it is necessary to prevent hole injection from occurring. Preventing hole injection requires that the high-temperature annealing be performed under conditions that will afford a lower oxidation rate.

It is believed that the void defects 3 in the silicon wafer 1 tend to shrink in an atmosphere in which the oxide film 2 is not formed, such as an inert gas atmosphere or a reductive gas atmosphere.

However, if the silicon wafer 1 is subjected to a high-temperature heat treatment in such an atmosphere at 1300° C. or higher, silicon oxides (SiOx) are desorbed from the silicon wafer 1 as mentioned above, which fouls the reaction tube or the boat or other such parts inside the furnace, or leads to deterioration of the SiC boat itself Because this furnace fouling and decrease in furnace durability can be predicted, when a high-temperature heat treatment is actually performed at 1300° C. or higher, it is very difficult to perform it in an inert gas atmosphere or a reductive gas atmosphere, making it substantially essential that the heat treatment be performed in an oxygen gas atmosphere or an oxygen gas-containing atmosphere.

When the silicon wafers 1 are stacked, it is possible that the oxygen gas will not adequately reach the boundary between stacked wafers, which substantially results in low oxidation rate conditions. Consequently, with a stacked arrangement, void defects tend to shrink at the boundaries between wafers, but the void defects 3 become larger in the top and bottom silicon wafers 1 of the stacked silicon wafers 1 because the conditions afford a higher oxidation rate there.

Various examples specifically illustrating the thickness of the silicon oxide film, the temperature conditions during high-temperature heat treatment, the atmosphere conditions, and so forth will now be given.

First, comparative examples will be described in order to contrast the effect of the various examples.

COMPARATIVE EXAMPLE 1

A silicon wafer 1 that had a diameter of 200 mm and an oxygen concentration of 11×10$^{17}$ (atoms/cc) (ASTM F121-79) and that was a P type bare wafer (that is, only a natural oxide film was formed on the surface) was readied as the sample. This silicon wafer 1 was subjected to high-temperature annealing under the temperature and atmosphere conditions shown in FIG. 2.

Figure 7:
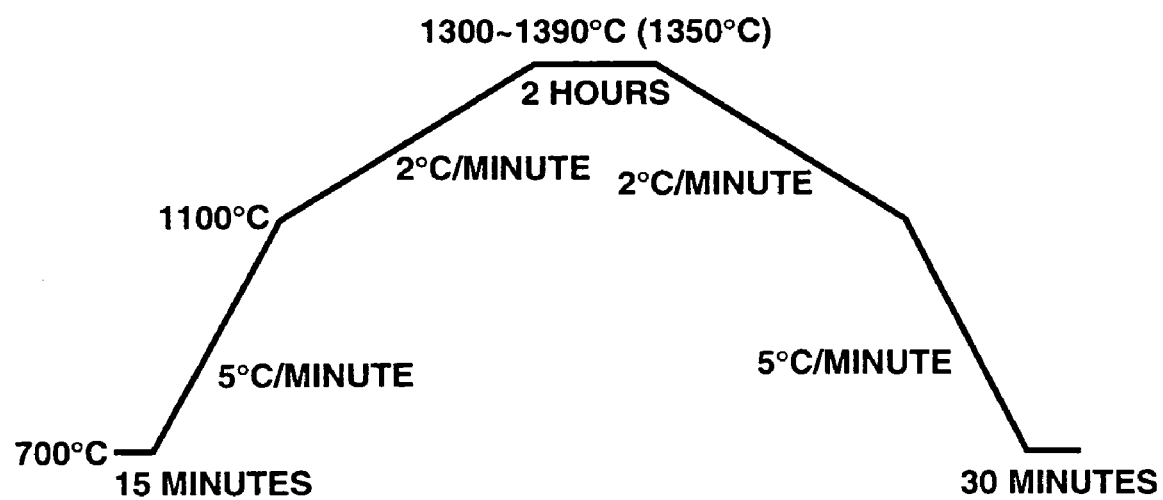
FIG. 7 is a diagram illustrating an example of a heat treatment recipe.

The annealing temperature recipe here is given as heat treatment recipe 1 in FIG. 7, in which the temperature was gradually raised from 700° C. up to various maximum temperatures between 1300 and 1390° C. (1300° C., 1350° C., and 1390° C.). After 2 hours of heat treatment at the maximum temperature, the temperature was gradually lowered.

Annealing was performed in an atmosphere based on argon gas and in which the oxygen partial pressure was between 0.5 and 100% (oxygen partial pressures of 0.5%, 30%, and 100%).

Next, the change in the size of the void defects 3 before and after heat treatment was observed by infrared scattering method. That is, the void defects 3 were captured by infrared tomography as laser defects tomography (LSTD), and the change in the size of the void defects 3 before and after heat treatment was analyzed and evaluated. The measurement device used for this purpose was an MO401 made by Mitsui Mining & Smelting.

Figure 8:
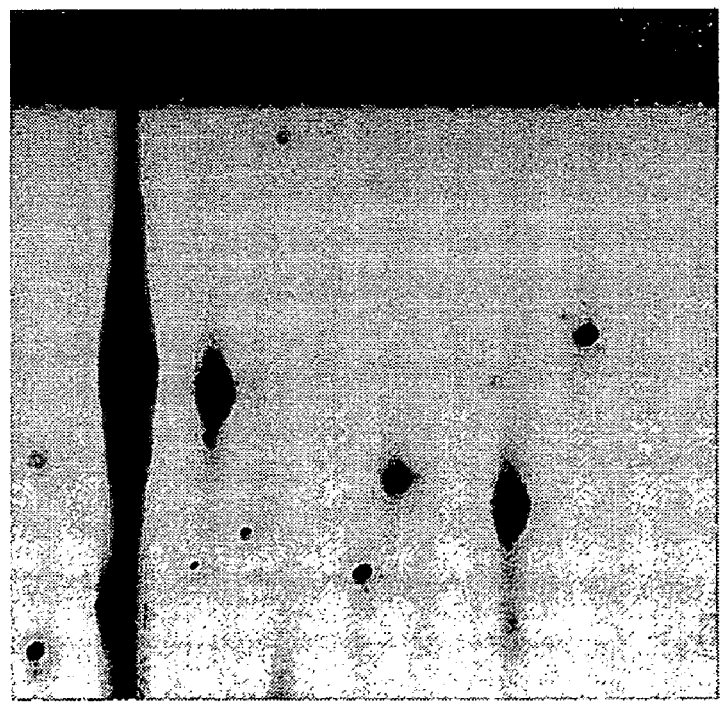
FIG. 8 is a photograph illustrating scattering images produced by defects after heat treatment.
Figure 9:
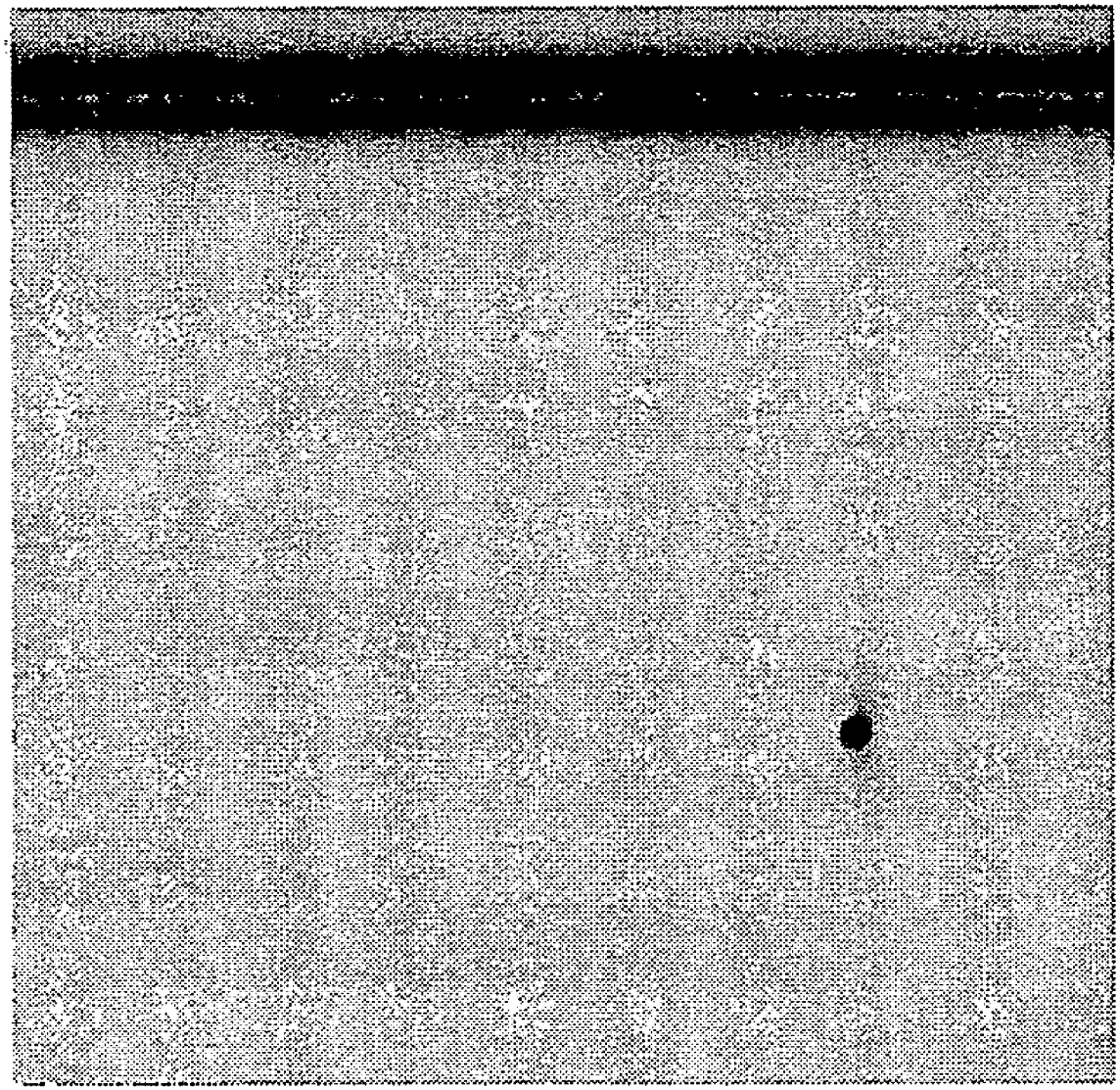
FIG. 9 is a photograph illustrating scattering images produced by defects before heat treatment.

FIG. 8 shows scattering images produced by defects after heat treatment, while FIG. 9 shows scattering images produced by defects before heat treatment FIG. 8 shows the scattering images when the heat treatment was performed for 2 hours at 1350° C. in an atmosphere with an oxygen partial pressure of 0.5%.

A comparison of FIGS. 8 and 9 reveals that in FIG. 8 the scattering intensity was higher and the defects became larger than the scattering images produced by defects before heat treatment shown in FIG. 9. Specifically, in FIG. 8, the enlargement of defects results in defects of high density being detected by measurement of one field. Usually only defects within a laser diameter of 6 µm are considered to scatter, but because the defects become larger, those defects present at locations away from the effective laser diameter become pronounced as scattering defects. When the defects are close to the center of the laser, individual defects exhibit the maximum scattering intensity. It can be seen that the defects become larger compared to the pre-heat treatment scattering images in FIG. 9, which were measured under the same conditions.

Next, in order to confirm the configuration of the defects, the positions of scattering defects obtained by infrared tomograph observations were marked, and a TEM (transmission electron microscope) observation sample was produced by FIM working. Defects were then observed by transmission electron microscope.

Figure 10:
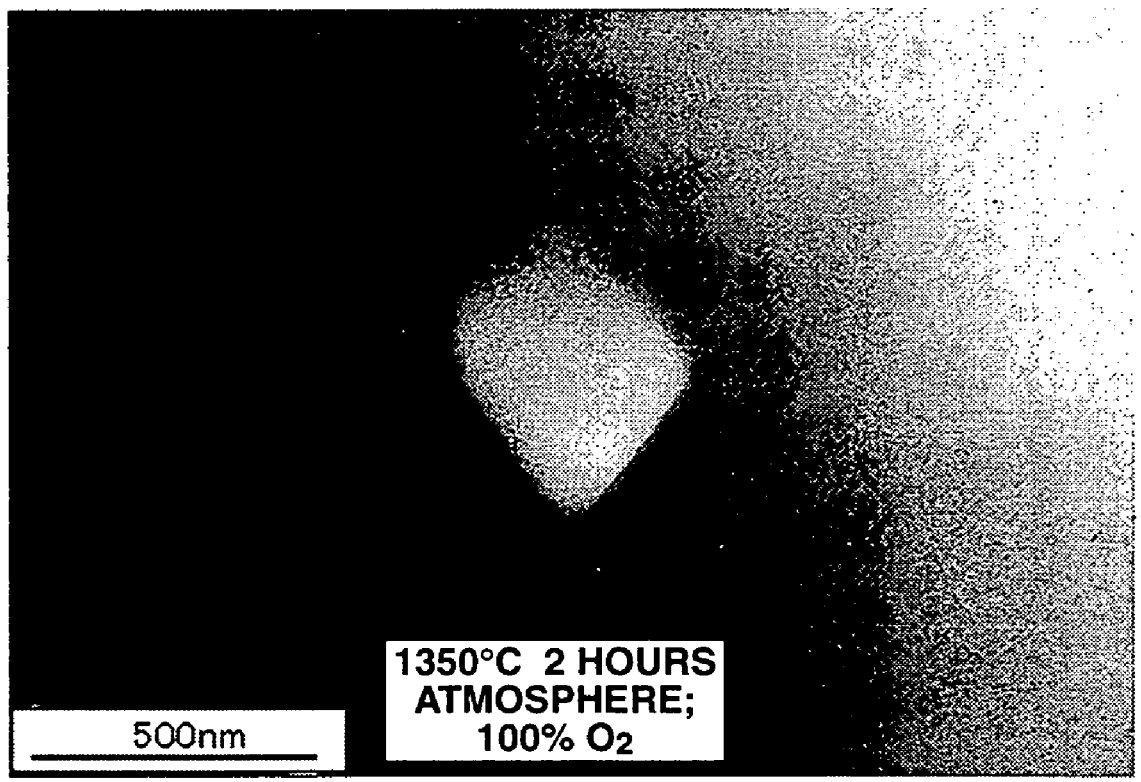
FIG. 10 is a TEM (transmission electron micrograph) of enlarged void defects.

FIG. 10 is a micrograph of defects taken with a TEM (transmission electron microscope).

As shown in FIG. 10, TEM observation confirmed the enlargement of defects. The enlarged defects had a diameter of 400 nm, and it can be seen that the defects are markedly larger in size than the diameter of 100 to 150 nm usually observed in as-grown silicon ingots.

EDX analysis was also performed, and as a result no signal produced by oxygen and no signal other than silicon was obtained from the interior of these defects and the silicon matrix boundary, which confirmed that defects with a higher scattering intensity are the void defects 3, and that they had become enlarged while still in the form of the void defects 3.

The same observations were made under different temperatures and oxygen partial pressures. These results are given in FIG. 2.

The symbols used in FIG. 2 are defined as follows. "x" indicates that the void defects 3 became enlarged after heat treatment, "Δ" indicates that the void defects 3 shrank after heat treatment, and "○" indicates that the void defects 3 disappeared after heat treatment These symbols are used with the same meaning in FIGS. 3 to 6 below.

As shown in FIG. 2, when various heat treatment temperatures of 1300° C., 1350° C., and 1390° C. and various oxygen partial pressure conditions of 0.5%, 30%, and 100% were combined, the void defects 3 were found to become larger after heat treatment in all cases except when the treatment temperature was 1300° C. and the oxygen partial pressure was 100%.

The above facts led to the conclusion that when a bare wafer is subjected to high-temperature annealing in an atmosphere with an oxygen partial pressure of at least 0.5% and at a temperature between 1300 and 1390° C., without the silicon wafer 1 undergoing any oxidation treatment, the void defects 3 will become larger in size than in an as-grown silicon ingot, except in a specific case.

EXAMPLE 1

A silicon wafer 1 was readied in the same manner as in Comparative Example 1. That is, a P type silicon wafer 1 with a diameter of 200 mm and an oxygen concentration of $11 \times 10^{17}$ (atoms/cc) (ASTMF121-79) was readied as the sample.

Next, this silicon wafer 1 was subjected to a thermal oxidation treatment for 80 minutes at 1100° C. to form an initial oxide film 2 of 700 nm on the surface. This thermal oxidation treatment was performed as a wet oxidation treatment. "Wet oxidation treatment" means that the oxidation treatment is carried out in an atmosphere containing water vapor. The term "initial oxide film" as used here means an oxide film formed on the silicon wafer 1 prior to performing high-temperature annealing.

Next, the silicon wafer 1 on which the initial oxide film 2 had been formed was subjected to high-temperature annealing under the same conditions as in Comparative Example 1 above.

Specifically, the annealing temperature recipe is given as heat treatment recipe 1 in FIG. 7, in which the temperature was gradually raised from 700° C. up to various maximum temperatures between 1300 and 1390° C. (1300° C., 1350° C., and 1390° C.). After 2 hours of heat treatment at the maximum temperature, the temperature was gradually lowered.

Annealing was performed in an atmosphere based on argon gas and in which the oxygen partial pressure was between 0.5 and 100% (oxygen partial pressures of 0.5%, 30%, and 100%).

Next, the change in the size of the void defects 3 before and after heat treatment was observed by infrared scattering method. TEM observation and EDX analysis were then performed, which confirmed that defects still in the form of the void defects 3 had either disappeared or shrunken after the heat treatment.

FIG. 3 shows the relationship between the various conditions (standards) and the change in the size of the void defects 3 (x: enlargement, Δ: shrinkage, ○: disappearance).

As shown in FIG. 3, the result was that the void defects 3 had either disappeared or shrunken after heat treatment, regardless of whether the heat treatment temperature was 1300° C., 1350° C., or 1390° C. or whether the oxygen partial pressure was 0.5%, 30%, or 100%.

The above leads to the conclusion that if the silicon wafer 1 is subjected to an oxidation treatment and then to high-temperature annealing in an atmosphere with an oxygen partial pressure of at least 0.5% and at a temperature between 1300 and 1390° C., the void defects 3 either disappear or shrink from their size in the as-grown silicon ingot.

EXAMPLE 2

It was confirmed in Example 1 above that the void defects 3 either disappeared or shrank when the thickness of the initial oxide film 2 was 700 nm, so the inventors next conducted an experiment to confirm the void defect elimination effect using the thickness of the initial oxide film 2 as a parameter.

The same silicon wafer 1 as in Comparative Example 1 and Example 1 was readied. That is, a P type silicon wafer 1 with a diameter of 200 mm and an oxygen concentration of $11 \times 10^{17}$ (atoms/cc) (ASTM F121-79) was readied as the sample.

Next, this silicon wafer 1 was subjected to a wet oxidation treatment at 1100° C. to produce various standard samples on whose surface was formed an initial oxide film 2 of 45, 175, 394, 500, or 700 nm.

Next, the silicon wafer 1 on which the oxide film 2 had been formed was subjected to high-temperature annealing.

Specifically, the annealing temperature recipe is given as heat treatment recipe 1 in FIG. 7, in which the temperature was gradually raised from 700° C. up to a maximum temperature of 1350° C. After heat treatment for 2 hours at 1350° C., the temperature was gradually lowered.

Annealing was performed in an atmosphere based on argon gas and in which the oxygen partial pressure was between 0.5 and 100% (oxygen partial pressures of 0.5%, 30%, and 100%).

Next, the change in the size of the void defects 3 before and after heat treatment was observed by infrared scattering method. TEM observation and EDX analysis were then performed, which confirmed that defects still in the form of the void defects 3 had either disappeared, shrunken, or become enlarged after the heat treatment, and that the void defect elimination effect is a function of the thickness of the initial oxide film 2.

Figure 12:
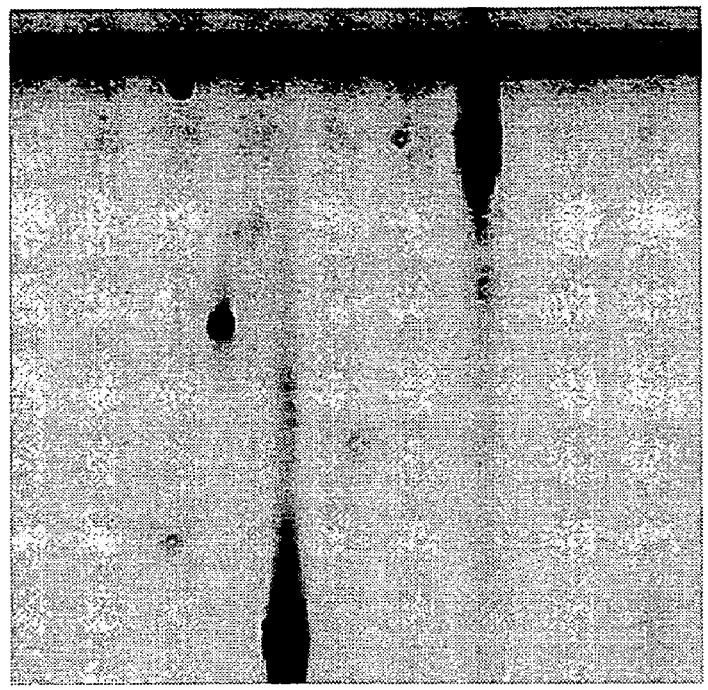
FIG. 12 is a photograph illustrating scattering images of enlarged defects.
Figure 13:
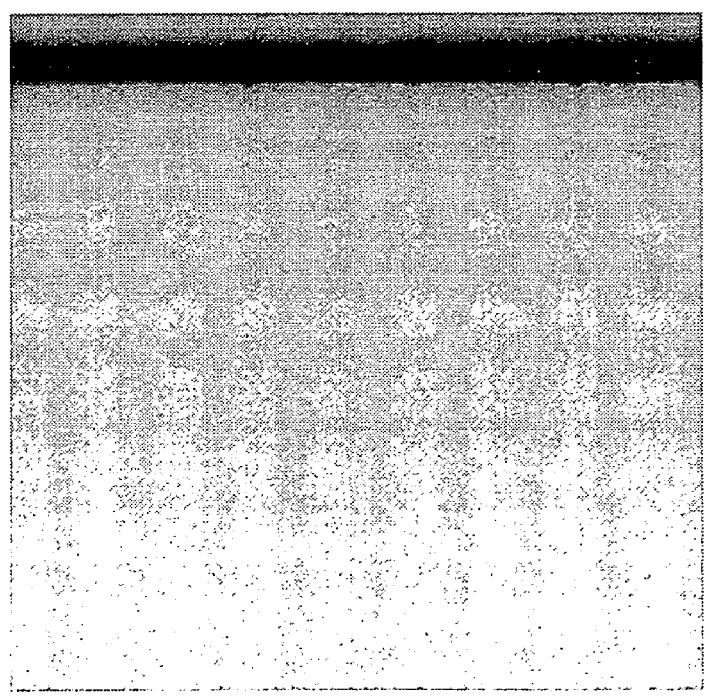
FIG. 13 is a photograph illustrating the results of observing a standard wafer in which defects had been shrunken and eliminated.

FIGS. 12 and 13 are photographs similar to FIG. 8 discussed above, and show the scattering images produced by defects after high-temperature annealing. FIG. 12 shows the results calculated for a silicon wafer 1 on which an initial oxide film 2 with a thickness of 45 nm had been formed, and FIG. 13 shows the results calculated for a silicon wafer 1 on which an initial oxide film 2 with a thickness of 700 nm had been formed. FIGS. 12 and 13 show the scattering images when heat treatment was performed for 2 hours at 1350° C. in an atmosphere with an oxygen partial pressure of 0.5%.

It is determined that defects have disappeared if no scattering by defects is seen in observation over a 20 mm radius of the silicon wafer.

As shown in FIG. 12, enlargement of the void defects 3 resulted in the observation of defects of a high apparent density as measured in a single field (200 μm×185 μm). This is because the effective laser diameter is about 6 μm in the case of an ordinary defect size, but in the case of enlarged defects, scattering is captured from a winder area of incidence.

As shown in FIG. 13, no scattering caused by void defects was observed when a scan of 20,000 μm was performed in the radial direction.

It can be seen from a comparison of FIGS. 12 and 13 that the void defects 3 became larger at the 45 nm film thickness shown in FIG. 12, whereas the void defects 3 disappeared at the 700 nm film thickness shown in FIG. 13.

Measurements were made at low magnification in order to examine the depth of defect disappearance in the silicon wafer 1 from the defects had been eliminated, which confirmed that no void defects 3 were present anywhere in the depth direction.

FIG. 4 shows the relationship between the change in the size of the void defects 3 (x: enlargement, Δ: shrinkage, ○: disappearance) and the atmosphere (oxygen partial pressure of 0.5, 30, or 100%) and the thickness of the initial oxide film 2 (45, 175, 394, 500, or 700 nm). The results for a natural oxide film (film thickness of 0) are also given as a comparative example.

As shown in FIG. 4, when the oxygen partial pressure was 0.5%, shrinkage was noted in the void defects 3 even when the thickness of the initial oxide film 2 was 396 nm. The results indicate that in order for the void defects 3 to be eliminated regardless of the oxygen partial pressure, the initial oxide film 2 must be formed in a thickness of at least 500 nm.

Figure 11:
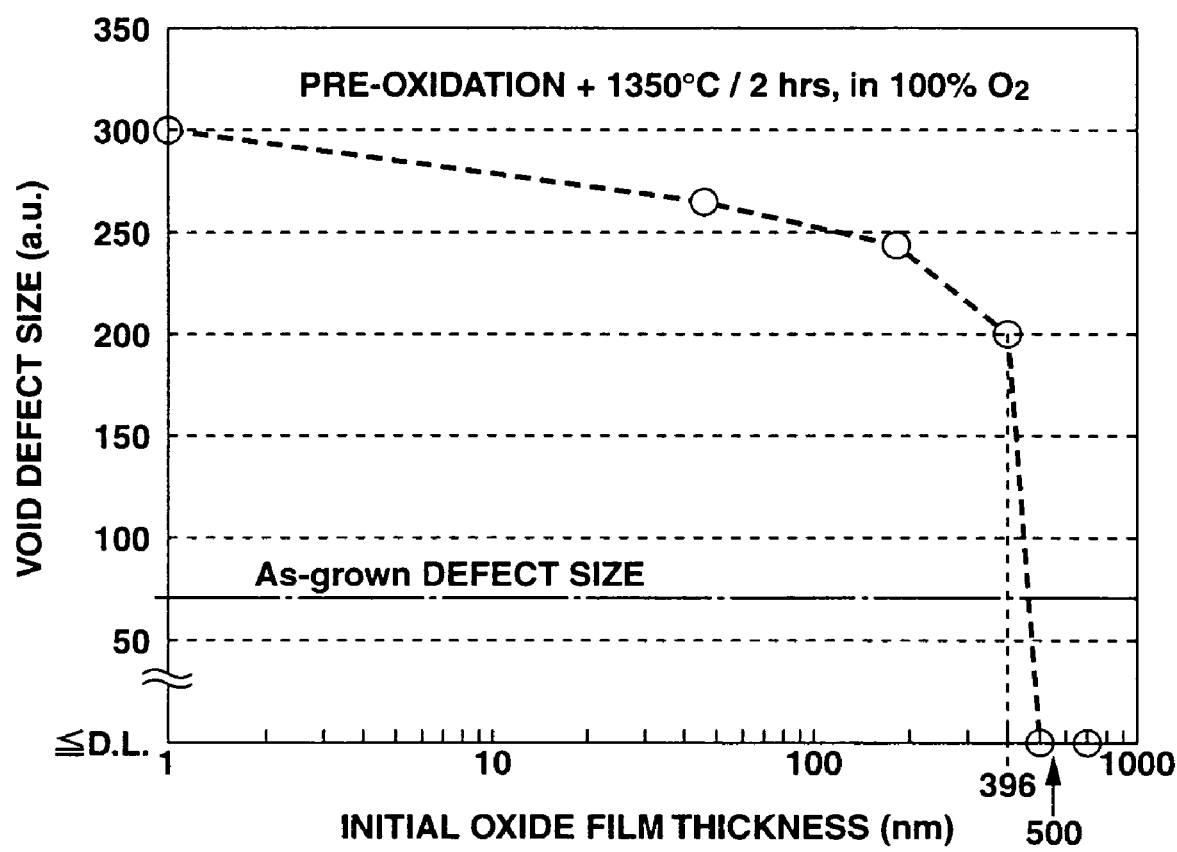
FIG. 11 is a graph of the results of Example 2, and shows the relationship between the initial oxide film thickness and the size of the void defects after high-temperature annealing.

FIG. 11 is a graph in which the thickness of the initial oxide film 2 is plotted against the size of the void defects 3 after high-temperature annealing (2 hours of annealing at 1350° C.) in an atmosphere with an oxygen partial pressure of 100%. The horizontal axis in FIG. 11 is the thickness (nm) of the initial oxide film 2, while the vertical axis is the size (a.u.) of the void defects 3 after heat treatment. The one-dot chain line in FIG. 11 indicates the size of the void defects 3 in an as-grown silicon ingot.

As shown in FIG. 11, if the thickness of the initial oxide film 2 is less than 396 nm, the void defects 3 become larger than in the as-grown silicon ingot, and there seems to be no void defect elimination effect, but once the film thickness reaches 396 nm and above, there is a sudden decrease in the size of the void defects 3, and it can be seen that the elimination of void defects increases sharply. If the thickness of the initial oxide film 2 is 500 nm, the void defects 3 shrink in size to below the detection limit (D.L), and it can be seen that the void defects 3 have disappeared. Therefore, an effect whereby the void defects 3 are eliminated is believed to be obtained when the film thickness is between 396 and 500 nm.

EXAMPLE 3

The minimum thickness (threshold value) of the initial oxide film 2 required to eliminate the void defects 3 was confirmed in Example 2 above, so the inventors next conducted an experiment to confirm that the minimum film thickness varies with the method of forming the oxide film prior to high-temperature annealing.

The same silicon wafer 1 as in Comparative Example 1 and Examples 1 and 2 was readied. That is, a P type silicon wafer 1 with a diameter of 200 mm and an oxygen concentration of $11 \times 10^{17}$ (atoms/cc) (ASTM F121-79) was readied as the sample.

Next, the initial oxide film 2 was formed on the silicon wafer 1 by the various oxide film formation methods listed below. The treatment temperature for each of these oxide film formation methods is also given below.

① Wet oxidation treatment, at a temperature of 1100° C.
② Dry oxidation treatment, at a temperature of 1100° C.
③ CVD (chemical vapor deposition), at a treatment temperature of 430° C.

The dry oxidation treatment is thermal oxidation just as is the wet oxidation treatment, but differs from the wet oxidation treatment in that the treatment is performed in a dried atmosphere containing no water vapor.

Samples of various standards were produced by forming initial oxide films 2 of various thickness between 55 and 840 nm.

Next, the silicon wafer 1 on which the oxide film 2 had been formed was subjected to high-temperature annealing.

Specifically, the annealing temperature recipe is given as heat treatment recipe 1 in FIG. 7, in which the temperature was gradually raised from 700° C. up to a maximum temperature of 1350° C. After heat treatment for 2 hours at 1350° C., the temperature was gradually lowered. The annealing was performed in an atmosphere with an oxygen partial pressure of 100%.

Next, the change in the size of the void defects 3 before and after heat treatment was observed by infrared scattering method. TEM observation and EDX analysis were then performed, which confirmed that defects still in the form of the void defects 3 had either disappeared, shrunken, or become enlarged after the heat treatment, and that the minimum thickness of the initial oxide film 2 required to eliminate the void defects is a function of the oxide film formation method.

FIG. 5 shows the relationship between the change in the size of the void defects 3 (x: enlargement, Δ: shrinkage, ○: disappearance) and the initial oxide film thickness (55 to 840 nm) and the oxide film formation method (wet oxidation treatment, dry oxidation treatment, or CVD).

As shown in FIG. 5, the void defects 3 were eliminated best by dry oxidation, then wet oxidation, and then CVD, and the minimum thickness of the initial oxide film 2 required to eliminate the void defects 3 increased in this same order.

Figure 14:
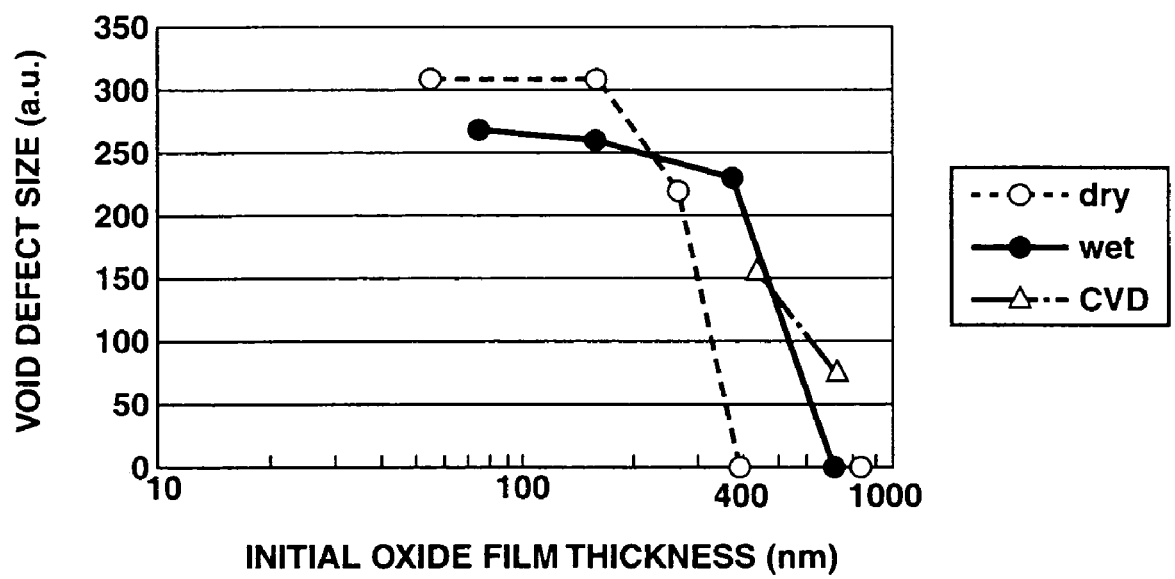
FIG. 14 is a graph of the results of Example 3, illustrates the relationship between the initial oxide film thickness and the size of the void defects after high-temperature annealing, and shows how the oxide film formation method affects the initial oxide film thickness required to eliminate void defects.

FIG. 14 is a graph in which the size of the void defects 3 after high-temperature annealing under the same conditions as in FIG. 11, namely, 2 hours at 1350° C. in an atmosphere with an oxygen partial pressure of 100%, is plotted against the thickness of the initial oxide film and the oxide film formation method (wet oxidation treatment, dry oxidation treatment, or CVD). The horizontal axis in FIG. 14 is the thickness (nm) of the initial oxide film 2, while the vertical axis is the size (a.u.) of the void defects 3 after heat treatment. The dashed line plotted with white circles in FIG. 14 indicates when a dry oxidation treatment was performed, the solid line plotted with black circles indicates when a wet oxidation treatment was performed, and the one-dot chain line plotted with triangles indicates when CVD was performed.

As shown in FIG. 14, the thickness of the initial oxide film 2 at which there is a sudden increase in the elimination of void defects through shrinkage of the void defects 3 (the minimum film thickness required to eliminate void defects) is greater with the dry oxidation treatment, then the wet oxidation treatment, and then CVD. To eliminate the void defects 3 with a dry oxidation treatment, the initial oxide film 2 must be formed in a thickness of at least 400 nm. Therefore, to eliminate the void defects 3 with all of these oxide film formation methods (dry oxidation treatment, wet oxidation treatment, and CVD), it is believed that the initial oxide film 2 must be formed in a thickness of 400 nm on the silicon wafer 1 prior to the high-temperature annealing.

Therefore, the results of the above Examples 2 and 3 suggest that to eliminate the void defects 3, the initial oxide film 2 must be formed in a minimum thickness of between 396 and 400 nm on the silicon wafer 1 prior to high-temperature annealing.

EXAMPLE 4

An experiment was conducted to confirm how the temperature during high-temperature annealing that is required to eliminate void defects fluctuates with the initial oxygen concentration in the silicon wafer 1. The phrase "initial oxygen concentration" as used here means the oxygen concentration in the silicon wafer 1 before the heat treatment is performed.

Substantially the same silicon wafer 1 as in Comparative Example 1 and Examples 1 and 2 was readied. That is, a P type silicon wafer 1 with a diameter of 200 mm was readied as the sample. In the case of Example 4, each sample with the initial oxygen concentration of ① $10 \times 10^{17}$ (atoms/cc) (ASTM F121-79)
② $20 \times 10^{17}$ (atoms/cc) (ASTMF121-79) was prepared.

Next, the silicon wafer 1 on which the oxide film 2 had been formed was subjected to high-temperature annealing.

Figure 15:
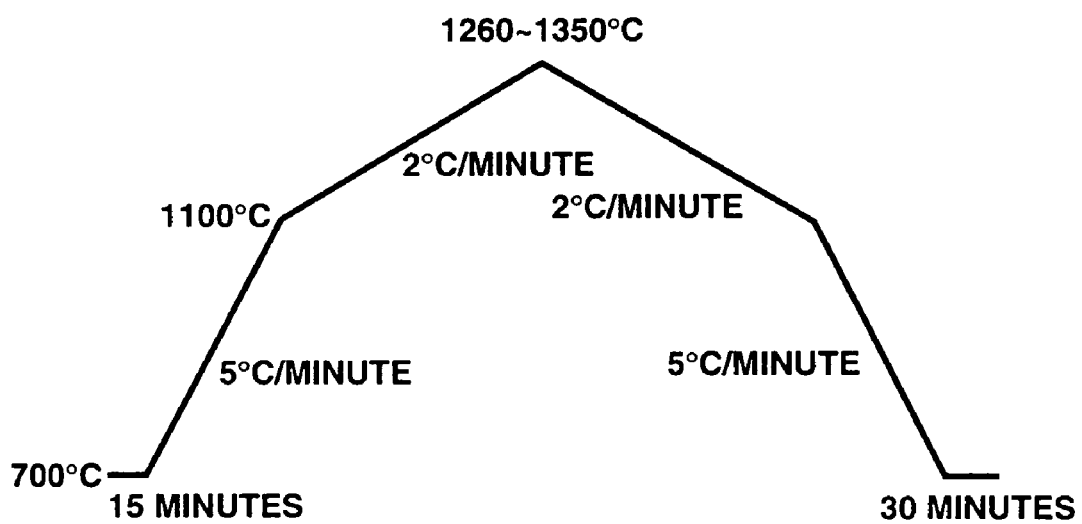
FIG. 15 is a diagram illustrating an example of a heat treatment recipe.

Specifically, the annealing temperature recipe is given as heat treatment recipe 2 in FIG. 15, in which the temperature was gradually raised from 700° C. up to various maximum temperatures between 1260 and 1350° C. The temperature was then gradually decreased from this maximum. The annealing was performed in an atmosphere with an oxygen partial pressure of 0.5%. The annealing time at the maximum temperature was 2 hours in FIG. 7, but in FIG. 15 the temperature was lowered so that no time was spent at the maximum temperature.

Next, the change in the size of the void defects 3 before and after heat treatment was observed by infrared scattering method. TEM observation and EDX analysis were then performed, which confirmed that defects still in the form of the void defects 3 had either disappeared, shrunken, or become enlarged after the heat treatment, and that the temperature during high-temperature annealing required to eliminate the void defects, that is, the maximum temperature of the annealing temperature recipe shown in FIG. 15, fluctuates with the initial oxygen concentration.

Figure 16:
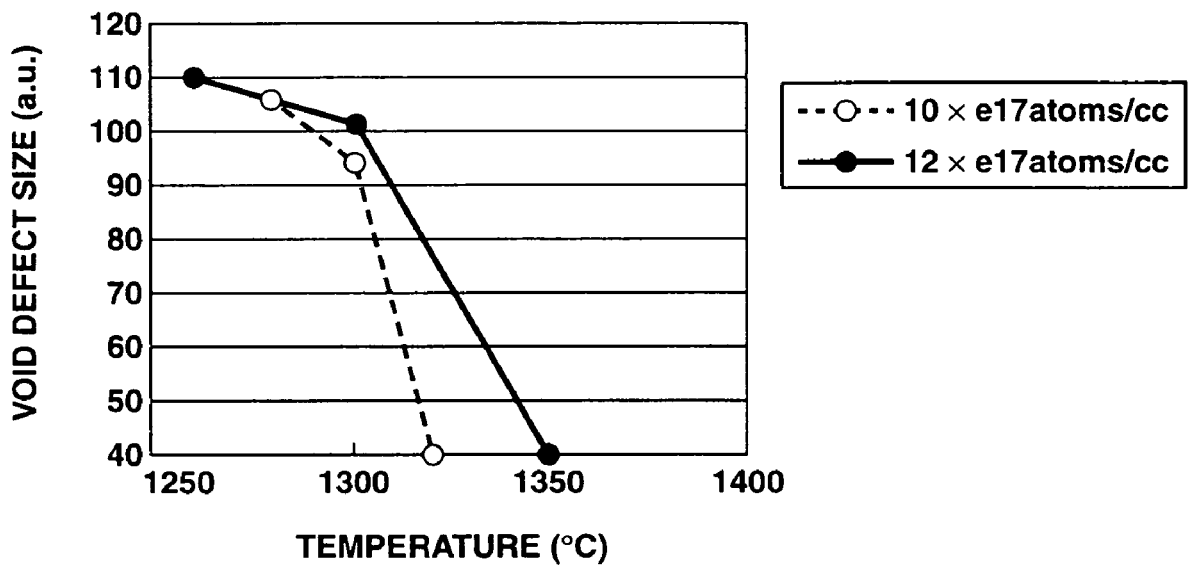
FIG. 16 is a graph of the results of Example 4, illustrates the relationship between the temperature during high-temperature annealing and the size of the void defects after high-temperature annealing, and shows how the initial oxygen concentration affects the temperature required to eliminate void defects.

FIG. 16 is a graph in which the size of the void defects 3 after high-temperature annealing in an atmosphere with an oxygen partial pressure of 0.5% is plotted against the initial oxygen concentration ($10 \times 10^{17}$ (atoms/cc) (ASTMF121-79), $12 \times 10^{17}$ (atoms/cc) (ASTM F121-79)). The horizontal axis in FIG. 16 is the temperature (° C.) during high-temperature annealing, while the vertical axis is the size (a.u.) of the void defects 3 after heat treatment. The dashed line plotted with white circles in FIG. 16 indicates when the initial oxygen concentration was $10 \times 10^{17}$ (atoms/cc) (ASTM F121-79), and the solid line plotted with black circles indicates when the initial oxygen concentration was $12 \times 10^{17}$ (atoms/cc) (ASTMF121-79).

As shown in FIG. 16, the temperature during high-temperature annealing at which the size of the void defects 3 shrinks and the void defects are eliminated (the minimum temperature required to eliminate void defects) rises in proportion to the initial oxygen concentration, and the size of the void defects 3 shrinks suddenly at around 1300° C., so it is believed that a void defect elimination effect appears in the vicinity of 1300° C. If the initial oxygen concentration is $10 \times 10^{17}$ (atoms/cc) (ASTM F121-79), then the void defects 3 begin to shrink when the temperature during high-temperature annealing is at least 1280° C. Therefore, if the oxygen concentration is lower, the void defect elimination effect should appear at about 1280° C.

To obtain a void defect elimination effect at a higher oxygen concentration, the annealing has to be performed at a higher temperature, but if the initial oxygen concentration is no more than $14 \times 10^{17}$ (atoms/cc) (ASTM F121-79), it is predicted that a void defect elimination effect will appear at or below the permissible temperature (1380° C.). Also, a silicon wafer 1 with an initial oxygen concentration of $14 \times 10^{17}$ (atoms/cc) (ASTM F121-79) was readied, an initial oxide film 2 was formed in a thickness of 700 nm by wet oxidation, and then high-temperature annealing was performed at a treatment temperature of 1350° C. and in an atmosphere with an oxygen partial pressure of 0.5% using the heat treatment recipe 1 shown in FIG. 7, whereupon it was confirmed that the void defects 3 disappeared.

Therefore, to eliminate the void defects 3, it is believed that the high-temperature annealing must be performed at a temperature of at least about 1300° C. (1280 to 1300° C.). It is also believed that to eliminate the void defects 3 in high-temperature annealing, the initial oxygen concentration must be kept to no more than $14 \times 10^{17}$ (atoms/cc) (ASTM F121-79).

EXAMPLE 5

As discussed above, it is stated in prior art that the void defects 3 can be eliminated by subjecting a bare wafer (a silicon wafer that has not undergone an oxidation treatment) to a high-temperature heat treatment in an oxidizing atmosphere and at a temperature between 1100 and 1380° C. However, the following experiment revealed that in the case of a bare wafer that has not undergone an oxidation treatment prior to the high-temperature heat treatment, the void defects 3 do not disappear at all temperatures from 1100 to 1380° C., and there is a critical point at the temperature at which the void defects 3 disappear.

The same silicon wafer 1 as in Comparative Example 1 was readied. That is, a P type bare wafer 1 with a diameter of 200 mm and an oxygen concentration of $11 \times 10^{17}$ (atoms/cc) (ASTM F121-79) was readied as the sample.

Next, this bare wafer 1 was subjected to high-temperature annealing.

Specifically, the annealing temperature recipe was the same as in FIG. 7, and the temperature was gradually raised from 700° C. up to various maximum temperatures between 1200 and 1390° C. After heat treatment for 2 hours at these maximum temperatures, the temperature was gradually lowered.

Annealing was performed in an atmosphere with an oxygen partial pressure of 100%.

Next, the change in the size of the void defects 3 before and after heat treatment was observed by infrared scattering method. TEM observation and EDX analysis were then performed, which confirmed that defects still in the form of the void defects 3 had either disappeared or become enlarged after the heat treatment.

FIG. 6 shows the relationship between the change in the size of the void defects 3 (x: enlargement, ○: disappearance) and the various temperatures (1200 to 1390° C.) during high-temperature annealing.

As shown in FIG. 6, no change in the size of the void defects 3 was seen at 1200° C., and the void defects 3 became larger at 1310° C., 1320° C., 1350° C., and 1390° C., but the void defects 3 disappeared at temperatures of 1240° C., 1260° C., 1280° C., and 1300° C.

Figure 17:
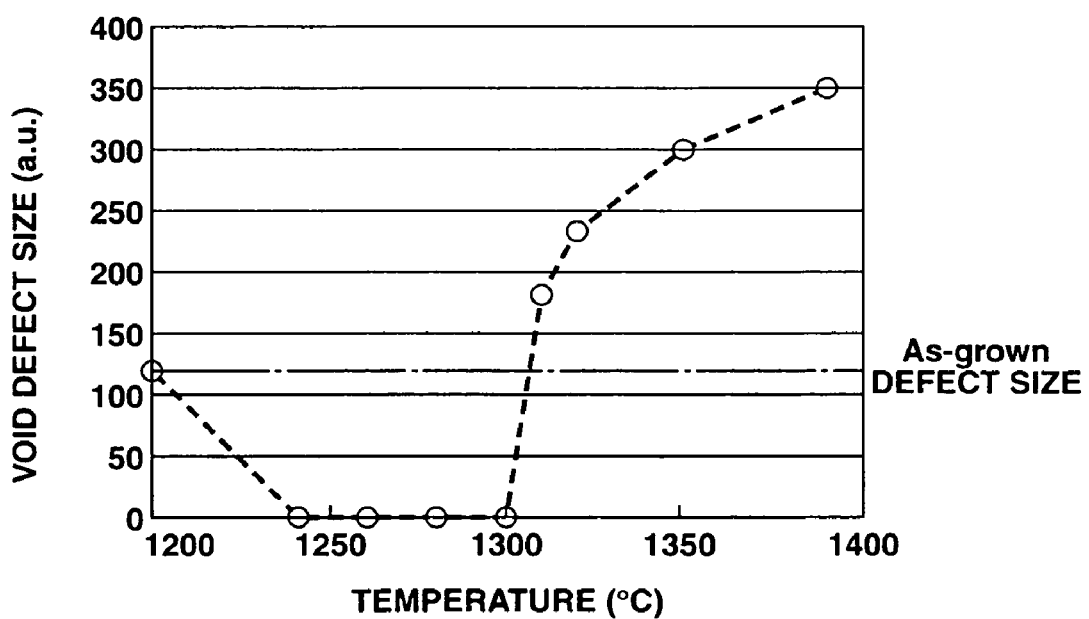
FIG. 17 is a graph of the results of Example 5, illustrates the relationship between the temperature during high-temperature annealing and the size of the void defects after high-temperature annealing, and shows the critical temperature in the heat treatment of a bare wafer.

FIG. 17 is a graph in which the size of the void defects 3 after high-temperature annealing was performed for 2 hours in an atmosphere with an oxygen partial pressure of 100% is plotted against the temperature during high-temperature annealing. The horizontal axis in FIG. 17 is the temperature (° C.) during high-temperature annealing, while the vertical axis is the size (a.u.) of the void defects 3 after heat treatment. The one-dot chain line in FIG. 17 indicates the size of the void defects 3 in an as-grown silicon ingot.

As shown in FIG. 17, if the temperature is 1200° C. or lower or 1310° C. or higher, there is either no change from the size with as-grown silicon, or the size is larger, and it is believed there is no void defect elimination effect, but within a temperature range of over 1200° C. and under 1310° C., the size of the void defects 3 is believed to shrink compared to the size with as-grown silicon, and a void defect elimination effect is obtained. Furthermore, it can be seen that the void defects 3 can be completely eliminated if the temperature range is narrowed to between 1240 and 1300° C.

Therefore, to eliminate the void defects 3 when a bare wafer is subjected to high-temperature annealing in an oxygen atmosphere, it is believed that the high-temperature annealing must be performed within a temperature range of over 1200° C. and under 1310° C. It seems to be preferable to perform the high-temperature annealing within a temperature range of 1240 to 1300° C.

EXAMPLE 6

In Examples 1 to 4 above, the silicon wafer 1 was subjected to an oxidation treatment and a high-temperature heat treatment, but it is also possible to subject a plurality of silicon wafers 1 to an oxidation treatment one by one, stack a plurality of these silicon wafers 1, and subjected the stacked silicon wafers 1 to ultra high temperature annealing at a temperature of at least about 1300° C. and in an oxygen atmosphere (with an oxygen partial pressure of 0.5 to 100%). In this case, unlike with prior art, the void defects 3 can be eliminated around the outer periphery of the middle silicon wafers 1 and on the oxide film 2 side of the uppermost and lowermost silicon wafers 1.

Also, in Examples 1 to 4, we assumed a case in which an oxidation treatment and high-temperature heat treatment were performed on a silicon wafer 1 sliced from a block (ingot) of single crystal silicon, but the oxidation treatment and high-temperature heat treatment may instead be performed directly on a block of single crystal silicon, in which case the void defects 3 present in the block of single crystal silicon can be eliminated.

EXAMPLE 7

In Example 5 above, a high-temperature heat treatment was performed on a bare wafer 1, but it is also possible to stack a plurality of bare wafers 1 and perform ultra high temperature annealing on a plurality of these stacked bare wafers 1 in an oxygen atmosphere (with an oxygen partial pressure of 0.5 to 100%) and within a temperature range of over 1200° C. and less than 1310° C. (preferably a temperature range of 1240 to 1300° C.). In this case, unlike with prior art, the void defects 3 can be eliminated around the outer periphery of the middle bare wafers 1 and on the oxide film 2 side of the uppermost and lowermost bare wafers 1 in FIG. 1c.

Also, in Example 5, we assumed a case in which a high-temperature heat treatment was performed on a bare wafer 1 sliced from a block (ingot) of single crystal silicon, but the high-temperature heat treatment may instead be performed directly on a block of single crystal silicon, in which case the void defects 3 present in the block of single crystal silicon can be eliminated.

EXAMPLE 8

In Examples 1 to 4, the ultra high temperature heat treatment was performed using the heat treatment recipe 1 or 2 shown in FIG. 7 or 15. In view of this, a step of performing an oxidation treatment and forming the initial oxide film 2 in the course of heating up to the temperature at which the ultra high temperature heat treatment is performed can be provided in FIG. 7 or 15.

In this case, a step of performing an oxidation treatment at a temperature of 1200° C. or below in the course of heating up to a temperature of 1200° C. or below can be provided.

EXAMPLE 9

In Examples 1 to 5, the ultra high temperature heat treatment was performed using the heat treatment recipe 1 or 2 shown in FIG. 7 or 15. In view of this, a step of performing a heat treatment for forming oxygen precipitation nuclei on the single crystal silicon 1 at a temperature of 400 to 1000° C. in the course of heating up to the temperature at which the ultra high temperature heat treatment is performed, or cooling from said temperature, can be provided in FIG. 7 or 15. Forming oxygen precipitation nuclei on the single crystal silicon 1 imparts an intrinsic gettering (IG) capability to the single crystal silicon 1.

In this case, one or more stages of heat treatment can be further performed at a temperature of 400 to 1000° C. after the ultra high temperature heat treatment, so as to form oxygen precipitation nuclei on the single crystal silicon 1.

EXAMPLE 10

In Example 5 above, it was revealed that to eliminate the void defects 3 by subjecting a bare wafer (a silicon wafer that has not undergone an oxidation treatment) to high-temperature annealing in an atmosphere with an oxygen partial pressure of 100%, the high-temperature annealing must be performed within a temperature range of over 1200° C. and less than 1310° C.

The inventors conducted subsequent experiments, and found that the conditions for eliminating the void defects 3 vary with the following parameters.

① The initial oxygen concentration in the single crystal silicon 1

② The oxygen partial pressure of the atmosphere in the course of raising the temperature to the level during high-temperature annealing ⓪ The oxygen partial pressure of the atmosphere while the high-temperature annealing is being performed ④ The temperature at which the high-temperature annealing is performed.

The ranges for the various parameters for eliminating the void defects 3 were specified, which is described below.

FIG. 18 is a table of the changes (x: enlargement, Δ: shrinkage, ◯: disappearance) in the size of void defects 3 when the oxygen partial pressure of the atmosphere during high-temperature annealing was 100% and the initial oxygen concentration of the single crystal silicon, the oxygen partial pressure of the atmosphere during heating, and the temperature during high-temperature annealing were varied. The high-temperature annealing was performed for 2 hours in an oxygen atmosphere with an oxygen partial pressure of 100%.

(1) When the initial oxygen concentration is low ($10 \times 10^{17}$ (atoms/cc)).

In the table in FIG. 18, when the initial oxygen concentration was $10 \times 10^{17}$ (atoms/cc) and the oxygen partial pressure of the atmosphere during heating was 0.5%, this corresponds to the case in FIG. 17, and the void defects 3 either shrank or disappeared when the temperature during high-temperature annealing was within a range of over 1200° C. to less than 1310° C., but the void defects became larger when the temperature during high-temperature annealing was 1310° C. or higher.

In contrast, when the initial oxygen concentration was left at $10 \times 10^{17}$ (atoms/cc) and the oxygen partial pressure of the atmosphere during heating was 100%, so that the oxygen atmosphere during heating was the same as during high-temperature annealing, the void defects 3 could be eliminated even when the temperature during high-temperature annealing was 1310° C. or higher.

(2) When the initial oxygen concentration is high ($15 \times 10^{17}$ (atoms/cc)).

When the initial oxygen concentration was $15 \times 10^{17}$ (atoms/cc) and the oxygen partial pressure of the atmosphere during heating was 0.5%, there was almost no change in the size of the void defects when the temperature during high-temperature annealing was 1280° C. or lower. The void defects 3 tended to become larger when the temperature during high-temperature annealing was set at 1300° C. or higher.

In contrast, when the initial oxygen concentration was left at $15 \times 10^{17}$ (atoms/cc) and the oxygen partial pressure of the atmosphere during heating was 100%, so that the oxygen atmosphere during heating was the same as during high-temperature annealing, the void defects 3 could be eliminated even when the temperature during high-temperature annealing was 1320° C. or higher.

FIG. 19 shows the experiment results when the oxygen partial pressure of the atmosphere during heating and the oxygen partial pressure of the atmosphere during high-temperature annealing were the same, and this table shows the relationship between the change (x: enlargement, Δ: shrinkage, ○: disappearance) in the size of void defects 3 and the initial oxygen concentration, the oxygen partial pressure of the atmosphere (during high-temperature annealing and during heating), and the temperature during high-temperature annealing. The high-temperature annealing was performed for 2 hours.

(1) When the initial oxygen concentration is low ($10 \times 10^{17}$ (atoms/cc)).

In the table in FIG. 19, the void defects 3 can be eliminated by obtaining $10 \times 10^{17}$ (atoms/cc) of the initial oxygen concentration, 25% of the oxygen partial pressure of the atmosphere, and 1260° C. or higher of the temperature of the high-temperature annealing.

(2) When the initial oxygen concentration is high ($10 \times 10^{17}$ (atoms/cc)).

When the initial oxygen concentration was $15 \times 10^{17}$ (atoms/cc), there was almost no change in the size of the void defects when the temperature during high temperature annealing was 1280° C. or lower, regardless of the oxygen partial pressure of the atmosphere. However, the void defects 3 could more or less be eliminated by setting the temperature during high temperature annealing to 1300° C. or higher and raising the oxygen partial pressure of the atmosphere to at least 75%.

Further experiments were conducted to complement the data in FIGS. 18 and 19.

FIGS. 20 to 26 are graphs of the data shown in FIGS. 18 and 19 of this supplemental data.

Figure 20:
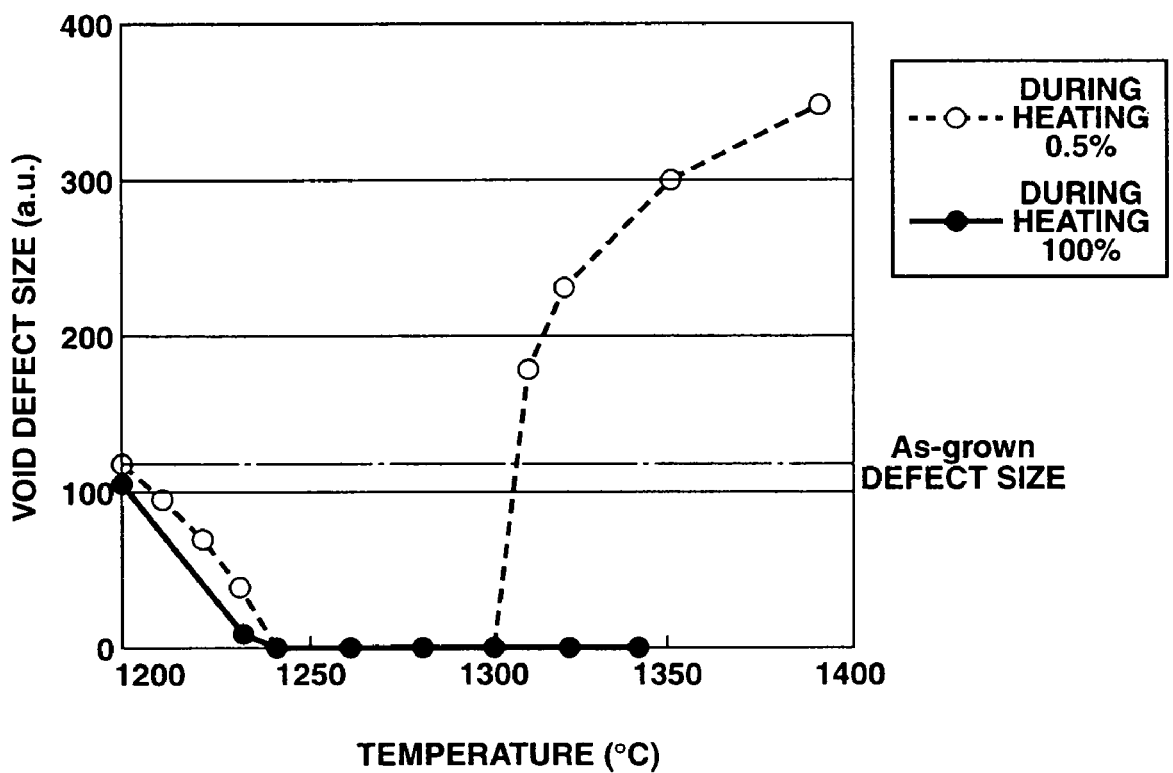
FIG. 20 is a graph of the temperature range over which void defects are eliminated, which varies with the oxygen partial pressure during heating, and is a graph of the relationship between the temperature during high-temperature annealing and the size of the void defects after high-temperature annealing.

FIG. 20 is a graph of the experiment results corresponding to when the initial oxygen concentration was $10 \times 10^{17}$ (atoms/cc). The horizontal axis is the temperature (° C.) during high temperature annealing, while the vertical axis is the size (a.u.) of the void defects 3 after heat treatment. The dashed line plotted with white circles in FIG. 20 indicates when the initial oxygen partial pressure of the atmosphere during heating was 0.5%, and the solid line plotted with black circles indicates when the oxygen partial pressure of the atmosphere during heating was 100%.

It can be seen from FIG. 20 that the higher is the oxygen partial pressure of the atmosphere, the better the void defects 3 will be eliminated, and that the temperature range during high temperature annealing over which the void defects 3 can be eliminated is expanded from a range of 1200 to 1310° C. to a wider range of 1200° C. and higher.

Figure 21:
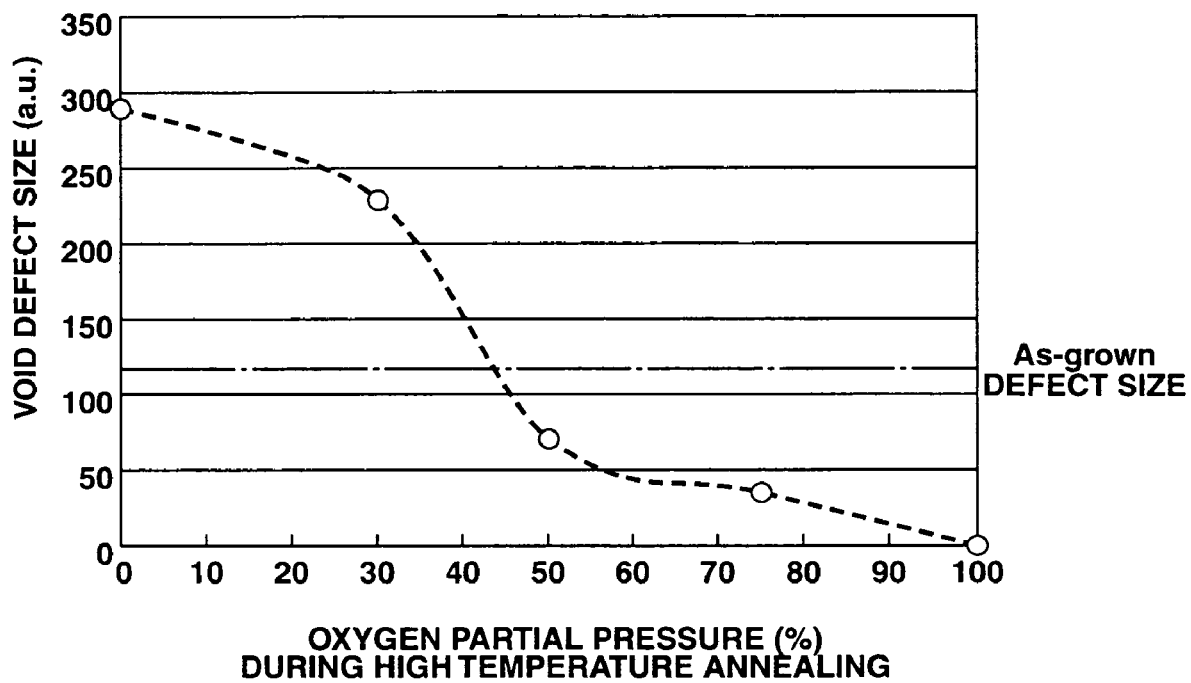
FIG. 21 is a graph of the effect that oxygen partial pressure has on the elimination of void defects, and is a graph of the relationship between the temperature during high-temperature annealing and the size of void defects after high-temperature annealing.

It is clear from the experiment results shown in FIG. 21 that the void defects 3 are eliminated better when the oxygen partial pressure of the atmosphere is higher.

FIG. 21 shows the relationship between the void defect size and the oxygen partial pressure of the atmosphere when a bare wafer is subjected to high temperature annealing for 2 hours at a temperature of 1300° C. The horizontal axis in FIG. 21 is the oxygen partial pressure (%) during high temperature annealing, and the vertical axis is the size (a.u.) of the void defects 3 after heat treatment.

It can be seen from 21 that the void defects 3 are eliminated better as the oxygen partial pressure in the atmosphere rises. The void defects 3 begin to shrink when the oxygen partial pressure of the atmosphere is in the vicinity of 40%, and it can be seen that the void defects 3 substantially disappear when the oxygen partial pressure of the atmosphere is at least 75%.

Figure 22:
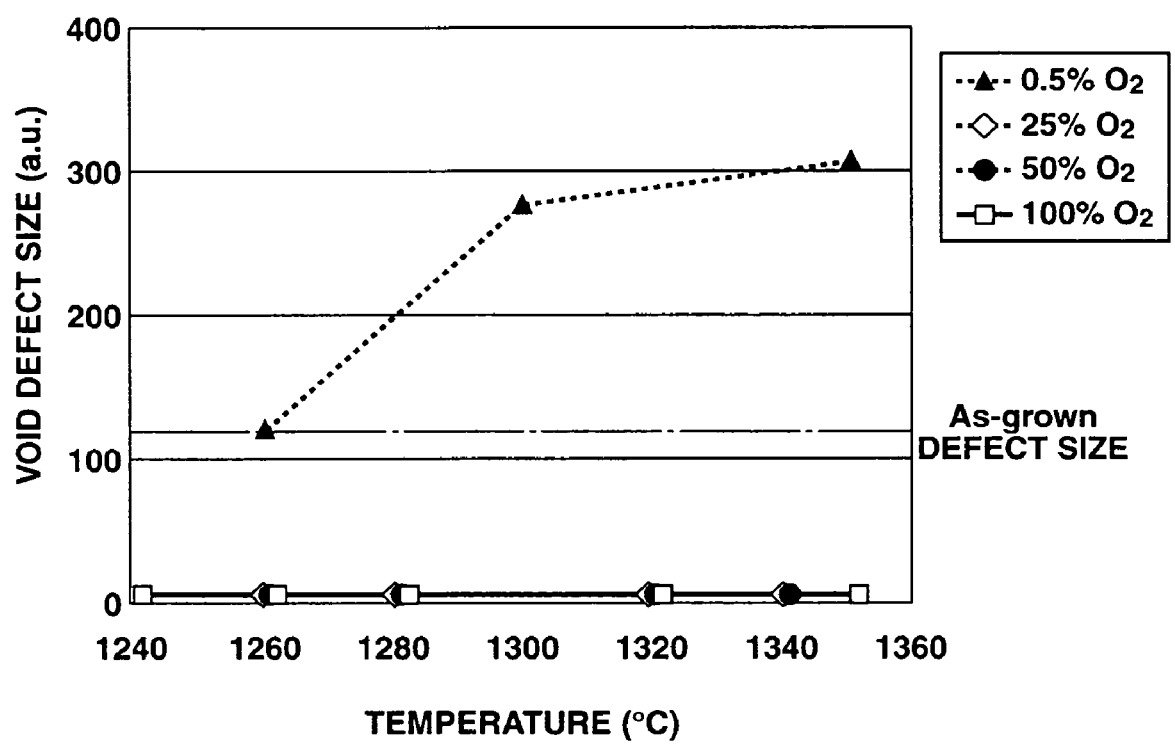
FIG. 22 is a graph of the temperature range over which void defects are eliminated, which varies with the oxygen partial pressure of the atmosphere, and is a graph of the relationship between the temperature during high-temperature annealing and the size of void defects after high-temperature annealing.

FIG. 22 shows the relationship between void defect size and the temperature during high temperature annealing at oxygen partial pressures of 0.5%, 25%, 50%, and 100% when the initial oxygen concentration was $10 \times 10^{17}$ (atoms/cc) and the oxygen partial pressure of the atmosphere during heating was the same as the oxygen partial pressure of the atmosphere during high temperature annealing. The horizontal axis in FIG. 22 is the temperature (° C.) during high temperature annealing, and the vertical axis is the size (a.u.) of the void defects 3 after heat treatment.

Figure 23:
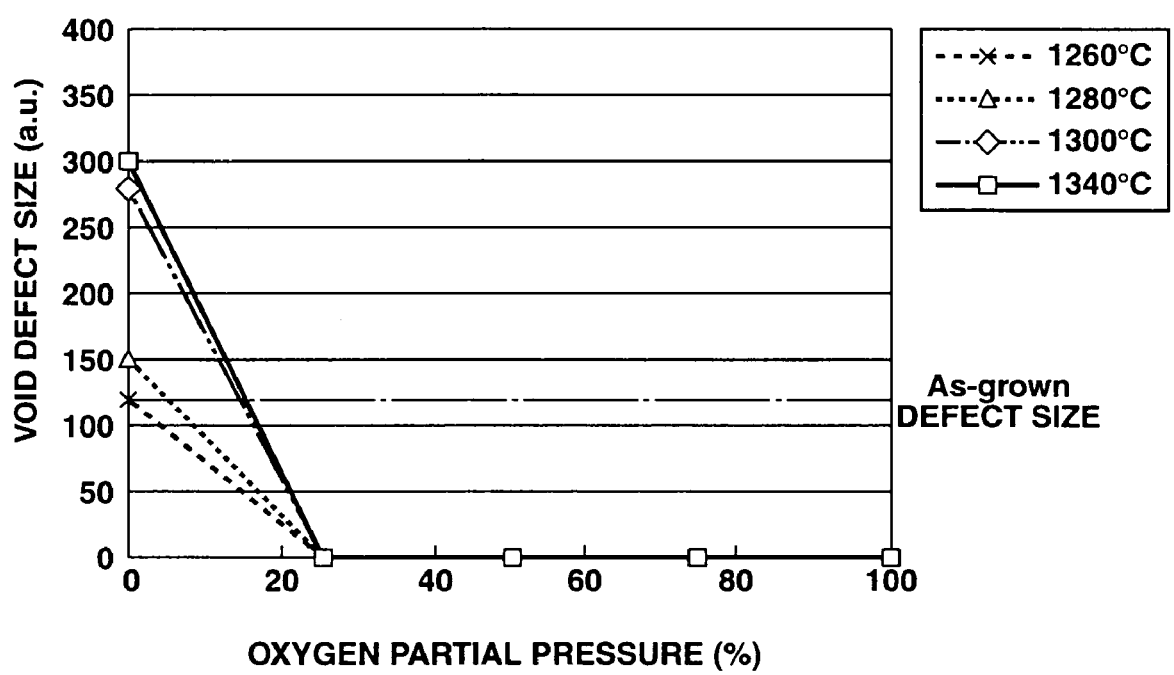
FIG. 23 is a graph of the range of the oxygen partial pressure of the atmosphere over which void defects are eliminated, which varies with the temperature during high-temperature annealing, and is a graph of the relationship between the oxygen partial pressure of the atmosphere and the size of void defects after high-temperature annealing.

FIG. 23 shows the relationship between void defect size and the oxygen partial pressure of the atmosphere at high temperature annealing temperatures of 1260° C., 1280° C., 1300° C., and 1340° C. when the initial oxygen concentration was $10 \times 10^{17}$ (atoms/cc) and the oxygen partial pressure of the atmosphere during heating was the same as the oxygen partial pressure of the atmosphere during high temperature annealing. The horizontal axis in FIG. 23 is the oxygen partial pressure (%) of the atmosphere, and the vertical axis is the size (a.u.) of the void defects 3 after heat treatment.

It can be seen from FIGS. 22 and 23 that the void defects 3 can be eliminated if the oxygen partial pressure of the atmosphere is at least 25% and the temperature during high temperature annealing is at least 1240° C.

Figure 24:
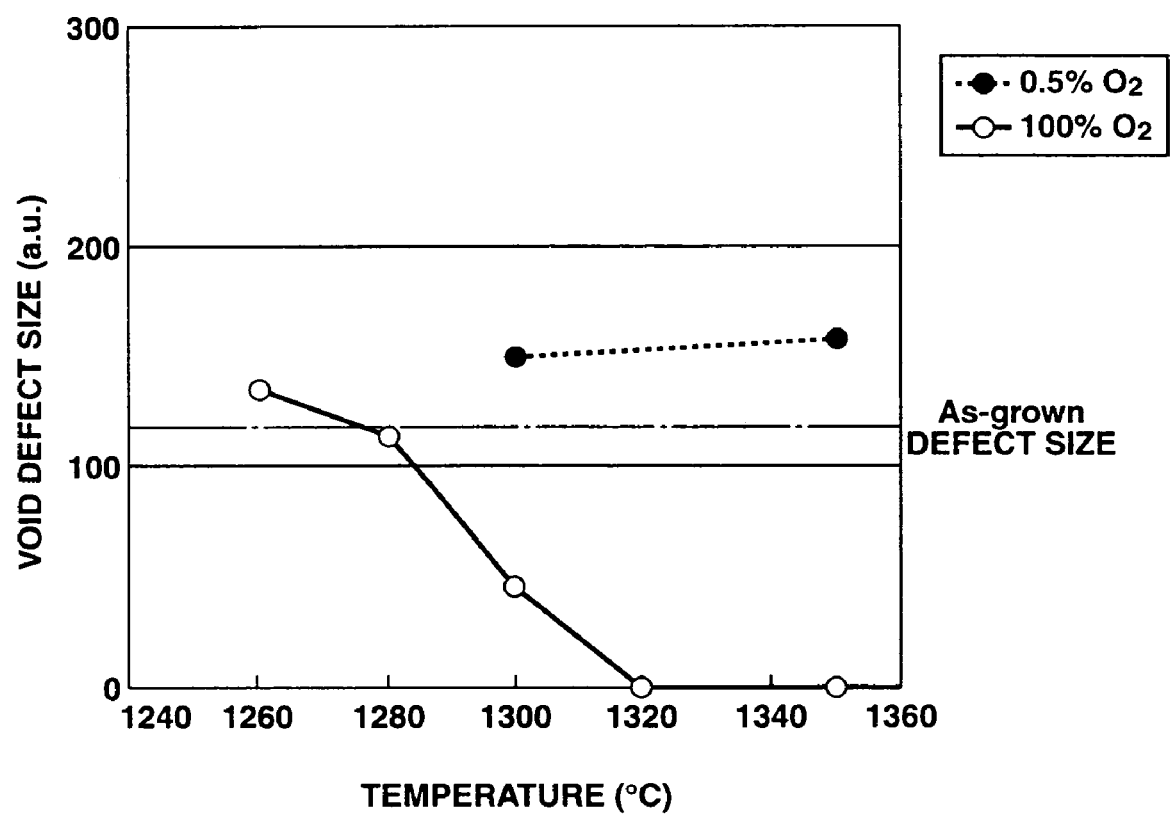
FIG. 24 is a graph of the temperature range over which void defects are eliminated, which varies with the oxygen partial pressure of the atmosphere during heating, and is a graph of the relationship between the temperature during high-temperature annealing and the size of void defects after high-temperature annealing.

FIG. 24 shows the relationship between void defect size and the temperature during high temperature annealing when the initial oxygen concentration was $15 \times 10^{17}$ (atoms/cc) and the oxygen partial pressure of the atmosphere during heating was varied between 80.5% and 100%. The horizontal axis in FIG. 24 is the temperature (° C.) during high temperature annealing, and the vertical axis is the size (a.u.) of the void defects 3 after heat treatment.

Figure 25:
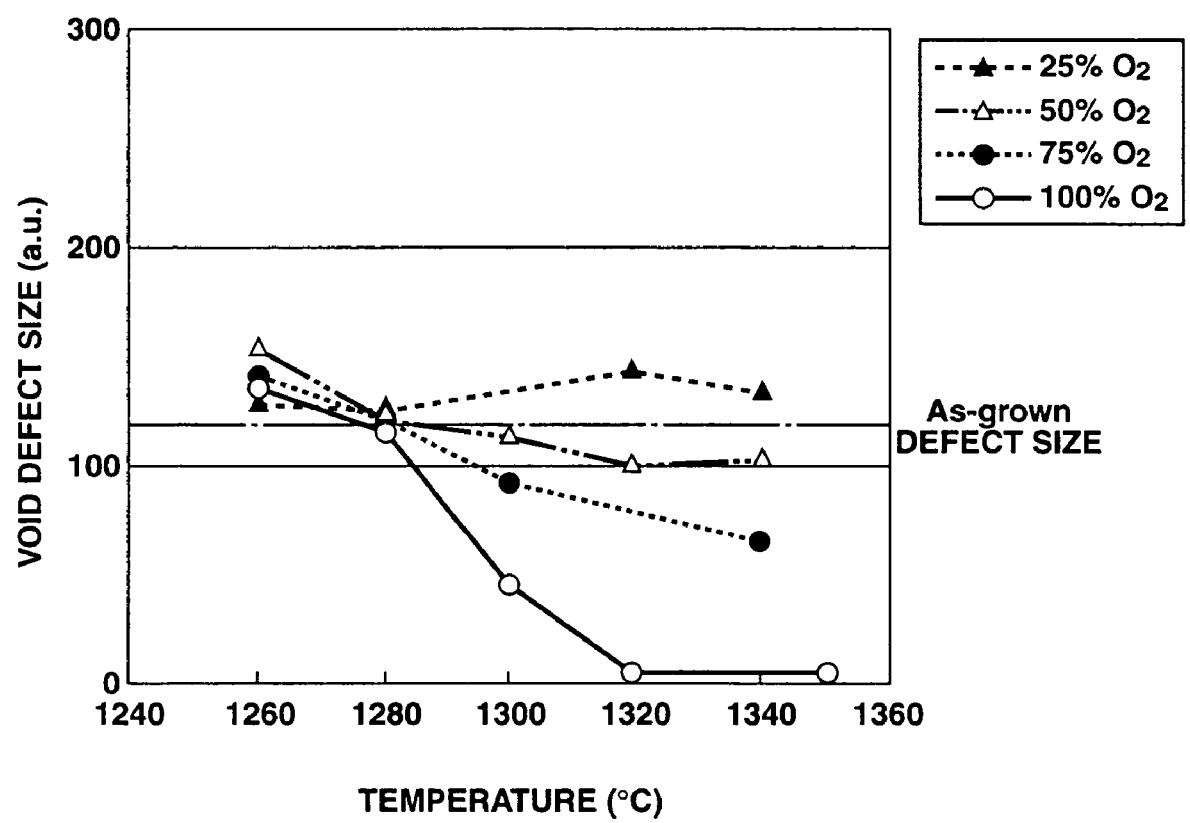
FIG. 25 is a graph of the temperature range over which void defects are eliminated, which varies with the oxygen partial pressure of the atmosphere, and is a graph of the relationship between the temperature during high-temperature annealing and the size of void defects after high-temperature annealing.
Figure 26:
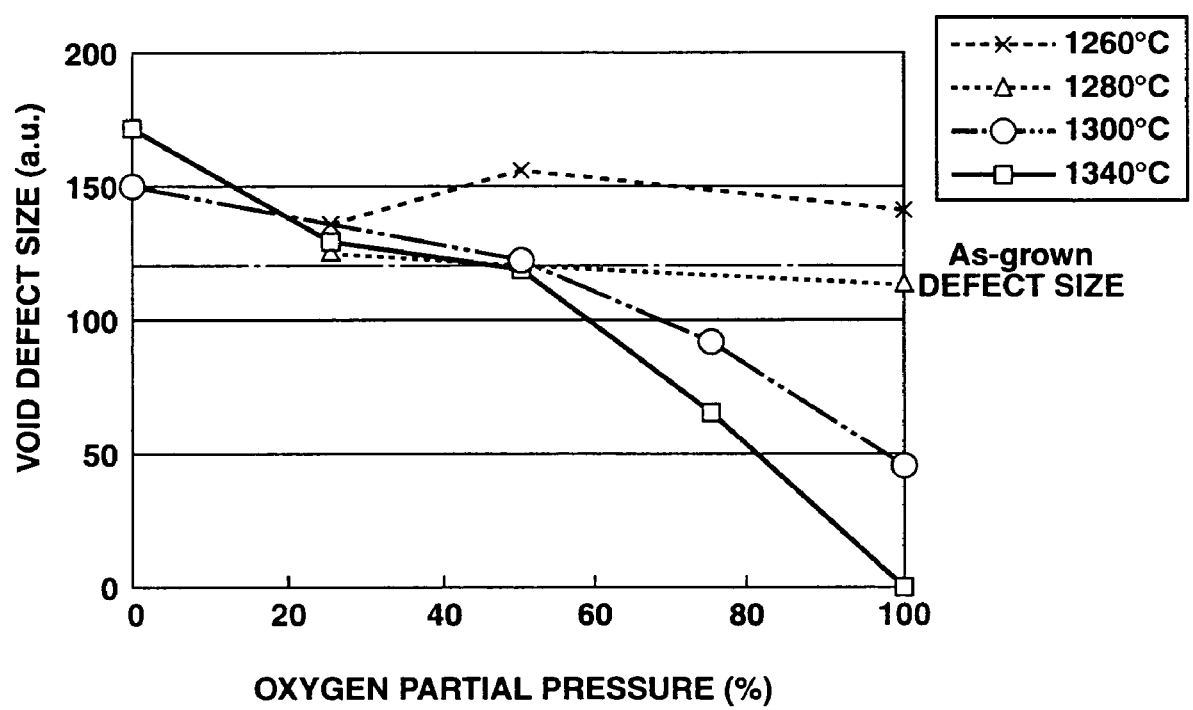
FIG. 26 is a graph of the range of the oxygen partial pressure of the atmosphere over which void defects are eliminated, which varies with the temperature during high-temperature annealing, and is a graph of the relationship between the oxygen partial pressure of the atmosphere and the size of void defects after high-temperature annealing.

FIG. 25 shows the relationship between void defect size and the temperature during high temperature annealing at oxygen partial pressures of 25%, 50%, 75%, and 100% when the initial oxygen concentration was $15\times10^{17}$ (atoms/cc) and the oxygen partial pressure of the atmosphere during heating was the same as the oxygen partial pressure of the atmosphere during high temperature annealing. The horizontal axis in FIG. 25 is the temperature (° C.) during high temperature annealing, and the vertical axis is the size (a.u.) of the void defects 3 after heat treatment FIG. 26 shows the relationship between void defect size and the oxygen partial pressure of the atmosphere at high temperature annealing temperatures of 1260° C., 1280° C., 1300° C., and 1340° C. when the initial oxygen concentration was $15\times10^{-17}$ (atoms/cc) and the oxygen partial pressure of the atmosphere during heating was the same as the oxygen partial pressure of the atmosphere during high temperature annealing. The horizontal axis in FIG. 25 is the oxygen partial pressure (%) of the atmosphere, and the vertical axis is the size (a.u.) of the void defects 3 after heat treatment.

As shown in FIGS. 24 to 26, if the initial oxygen concentration in the single crystal silicon is adjusted to a higher oxidation concentration ($15\times10^{17}$ (atoms/cc)) than $10\times10^{17}$ (atoms/cc), the void defects 3 can be eliminated if the temperature at which the high temperature annealing is performed is shifted to a temperature higher than 1260° C., and the oxygen partial pressure of the atmosphere is shifted to a pressure higher than 25%.

The following facts are clear from the above.

1) The void defects 3 can be eliminated within a temperature range of over 1200° C. and less than 1310° C. if the oxygen partial pressure of the atmosphere during high temperature annealing is set to at least 50% and the oxygen partial pressure of the atmosphere during heating up to the temperature during high temperature annealing is less than 25%.

2) The void defects 3 can be eliminated when the temperature during high temperature annealing is at least 1200° C. if the oxygen partial pressure of the atmosphere during high temperature annealing is set to at least 25% and the oxygen partial pressure of the atmosphere during heating up to the temperature during high temperature annealing is at least 25%.

3) The void defects 3 can be eliminated if the oxygen partial pressure of the atmosphere (during both high temperature annealing and heating) is set to at least 25% and the temperature during high temperature annealing is at least 1240° C.

4) As the initial oxygen concentration in the single crystal silicon rises higher than $10\times10^{17}$ (atoms/cc), the void defects 3 can be eliminated if the temperature during high temperature annealing is shifted to a temperature higher than 1260° C., and the oxygen partial pressure of the atmosphere (during both high temperature annealing and heating) is shifted to a pressure higher than 25%.

INDUSTRIAL APPLICABILITY

The present invention can be applied not only to a case in which a heat treatment is performed on a wafer of single crystal silicon, but also to a case in which heat treatment is performed on a block (ingot) of single crystal silicon, a plurality of silicon wafers, or stacked silicon wafers.

The invention claimed is:

1. A method for eliminating defects from single crystal silicon, comprising the steps of:
   forming an initial oxide film with a thickness of 396 nm or more on the single crystal silicon manufactured by the CZ method at a temperature of 1200° C. or lower; and
   performing an ultra high temperature heat treatment at a temperature of at least about 1300° C., after the initial oxide film has been formed and thereby eliminating any void defects present in the single crystal silicon.

2. The method for eliminating defects from single crystal silicon according to claim 1, wherein the ultra high temperature heat treatment is performed in an atmosphere with an oxygen partial pressure of 0.5 to 100%.

3. The method for eliminating defects from single crystal silicon according to claim 1, wherein the initial oxygen concentration in the single crystal silicon is no more than $14\times10^{17}$ (atoms/cc).

4. The method for eliminating defects from single crystal silicon according to claim 1, further comprising a step of performing a process of forming the initial oxide film at a temperature of 1200° C. or lower in the course of raising the temperature to the level at which the ultra high temperature heat treatment is performed.

5. The method for eliminating defects from single crystal silicon according to claim 1, further comprising a step of performing a heat treatment for forming oxygen precipitation nuclei in the single crystal silicon at a temperature of 400 to 1000° C. in the course of raising or lowering the temperature to or from the level at which the ultra high temperature heat treatment is performed.

6. The method for eliminating defects from single crystal silicon according to claim 1, wherein one or more stages of heat treatment are further performed at a temperature of 400 to 1000° C. after the ultra high temperature heat treatment has been performed, and oxygen precipitation nuclei are formed in the single crystal silicon.

7. A method for eliminating defects from single crystal silicon, in which single crystal silicon that has been manufactured by the CZ method and that has not undergone an oxidation treatment is subjected to an ultra high temperature heat treatment by being heated to an ultra high temperature in an oxygen gas atmosphere or an atmosphere containing oxygen gas, and then cooled, thereby eliminating any void defects present in the single crystal silicon, wherein void defects present in the single crystal silicon are eliminated by adjusting parameters comprising the initial oxygen concentration in the single crystal silicon, the oxygen partial pressure of the atmosphere during heating up to the ultra high temperature, the oxygen partial pressure of the atmosphere during the ultra high temperature heat treatment, and the temperature at which the ultra high temperature heat treatment is performed.

8. The method for eliminating defects from single crystal silicon according to claim 7, wherein the oxygen partial pressure of the atmosphere during the ultra high temperature heat treatment is at least 50%, the oxygen partial pressure of the atmosphere during heating up to the ultra high temperature is less than 25%, and the temperature at which the ultra high temperature heat treatment is performed is over 1200° C. but lower than 1310° C.

9. The method for eliminating defects from single crystal silicon according to claim 7, wherein the oxygen partial pressure of the atmosphere during the ultra high temperature heat treatment is at least 25%, the oxygen partial pressure of the atmosphere during heating up to the ultra high temperature is at least 25%, and the temperature at which the ultra high temperature heat treatment is performed is at least 1200° C.

10. The method for eliminating defects from single crystal silicon according to claim 7, wherein the oxygen partial pressure of the atmosphere during the ultra high temperature heat treatment and the oxygen partial pressure of the atmosphere during heating up to the ultra high temperature are at least 25%, and the temperature at which the ultra high temperature heat treatment is performed is at least 1240° C.

11. The method for eliminating defects from single crystal silicon according to claim 7, wherein as the initial oxygen concentration in the single crystal silicon is raised above $10 \times 10^{17}$ (atoms/cc), the temperature at which the ultra high temperature heat treatment is performed is raised above 1260° C., and the oxygen partial pressure of the atmosphere during the ultra high temperature heat treatment and the oxygen partial pressure of the atmosphere during heating up to the ultra high temperature are raised above 25%.

* * * * *